US011417646B2

(12) United States Patent
Mehrotra et al.

(10) Patent No.: US 11,417,646 B2
(45) Date of Patent: Aug. 16, 2022

(54) NPN HETEROJUNCTION BIPOLAR TRANSISTOR IN CMOS FLOW

(71) Applicant: Texas Instruments Incorporated, Dallas, TX (US)

(72) Inventors: Manoj Mehrotra, Bangalore (IN); Terry J. Bordelon, Niskayuna, NY (US); Deborah J. Riley, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/172,559

(22) Filed: Jun. 3, 2016

(65) Prior Publication Data

US 2016/0284691 A1    Sep. 29, 2016

Related U.S. Application Data

(62) Division of application No. 14/573,006, filed on Dec. 17, 2014, now Pat. No. 9,385,117.

(Continued)

(51) Int. Cl.
| | |
|---|---|
| *H01L 27/092* | (2006.01) |
| *H01L 27/06* | (2006.01) |
| *H01L 21/8249* | (2006.01) |
| *H01L 29/66* | (2006.01) |
| *H01L 29/417* | (2006.01) |
| *H01L 21/265* | (2006.01) |

(Continued)

(52) U.S. Cl.
CPC ........ *H01L 27/0623* (2013.01); *H01L 21/265* (2013.01); *H01L 21/26513* (2013.01); *H01L 21/8249* (2013.01); *H01L 23/535* (2013.01); *H01L 29/1054* (2013.01); *H01L 29/165* (2013.01); *H01L 29/41783* (2013.01); *H01L 29/66242* (2013.01); *H01L 29/66575* (2013.01); *H01L 29/66628* (2013.01); *H01L 29/66636* (2013.01); *H01L 29/737* (2013.01); *H01L 29/7378* (2013.01); *H01L 29/7833* (2013.01); *H01L 29/7834* (2013.01); *H01L 29/7848* (2013.01); *H01L 29/7849* (2013.01); *H01L 29/161* (2013.01); *H01L 29/6659* (2013.01)

(58) Field of Classification Search
CPC .................................................. H01L 27/0922
See application file for complete search history.

(56) References Cited

U.S. PATENT DOCUMENTS

| 6,881,976 B1* | 4/2005 | Zheng | ................. H01L 21/8249 257/192 |
| 2003/0193077 A1* | 10/2003 | Fujii | ................... H01L 21/8222 257/656 |

(Continued)

*Primary Examiner* — Jae Lee
(74) *Attorney, Agent, or Firm* — Andrew R. Ralston; Charles A. Brill; Frank D. Cimino

(57) ABSTRACT

An integrated circuit formed on a silicon substrate includes an NMOS transistor with n-channel raised source and drain (NRSD) layers adjacent to a gate of the NMOS transistor, a PMOS transistor with SiGe stressors in the substrate adjacent to a gate of the PMOS transistor, and an NPN heterojunction bipolar transistor (NHBT) with a p-type SiGe base formed in the substrate and an n-type silicon emitter formed on the SiGe base. The SiGe stressors and the SiGe base are formed by silicon-germanium epitaxy. The NRSD layers and the silicon emitter are formed by silicon epitaxy.

15 Claims, 22 Drawing Sheets

Related U.S. Application Data

(60) Provisional application No. 61/922,324, filed on Dec. 31, 2013.

(51) Int. Cl.
  *H01L 29/78* (2006.01)
  *H01L 29/165* (2006.01)
  *H01L 29/737* (2006.01)
  *H01L 23/535* (2006.01)
  *H01L 29/10* (2006.01)
  H01L 29/161 (2006.01)

(56) References Cited

U.S. PATENT DOCUMENTS

| | | | |
|---|---|---|---|
| 2005/0139921 A1* | 6/2005 | Kang | H01L 21/84 257/347 |
| 2009/0289279 A1* | 11/2009 | Khare | H01L 21/8249 257/190 |
| 2009/0309167 A1* | 12/2009 | Russ | H01L 21/8249 257/370 |
| 2011/0057266 A1 | 3/2011 | Wallner | |
| 2012/0112280 A1* | 5/2012 | Johnson | H01L 21/76237 257/347 |
| 2012/0309151 A1* | 12/2012 | Zhang | H01L 29/165 438/285 |
| 2014/0154856 A1* | 6/2014 | Alptekin | H01L 21/76883 438/299 |
| 2014/0167116 A1* | 6/2014 | Chevalier | H01L 21/8249 257/197 |
| 2014/0252491 A1* | 9/2014 | Onoda | H01L 27/092 257/369 |
| 2015/0069466 A1 | 3/2015 | Chang | |

\* cited by examiner

NPN HETEROJUNCTION BIPOLAR TRANSISTOR IN CMOS FLOW

CROSS-REFERENCE TO RELATED APPLICATIONS

This application is a divisional of U.S. Nonprovisional patent application Ser. No. 14/573,006, filed Dec. 17, 2014, which claims the benefit of U.S. Provisional Application 61/922,324, filed Dec. 31, 2013, the contents of both of which are herein incorporated by reference in its entirety.

FIELD OF THE INVENTION

This invention relates to the field of integrated circuits. More particularly, this invention relates to bipolar transistors and MOS transistors in integrated circuits.

BACKGROUND OF THE INVENTION

Bipolar transistors are formed in a complementary metal oxide semiconductor (CMOS) integrated circuit for applications where bipolar transistors outperform metal oxide semiconductor (MOS) transistors. For example heterojunction bipolar transistors have higher transconductance, higher output impedance and faster switching speed. When building bipolar transistors using a CMOS integrated circuit manufacturing flow, it is difficult to form high performance heterojunction bipolar transistors with desired values of bipolar transistor gain (hfe) and high frequency (fmax) without incurring significant additional processing cost and complexity.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit formed on a silicon substrate includes an n-channel metal oxide semiconductor (NMOS) transistor with n-channel raised source and drain (NRSD) layers adjacent to a gate of the NMOS transistor, a p-channel metal oxide semiconductor (PMOS) transistor with SiGe stressors in the substrate adjacent to a gate of the PMOS transistor, and an NPN heterojunction bipolar transistor (NHBT) with a p-type SiGe base formed in the substrate and an n-type silicon emitter formed on the SiGe base.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
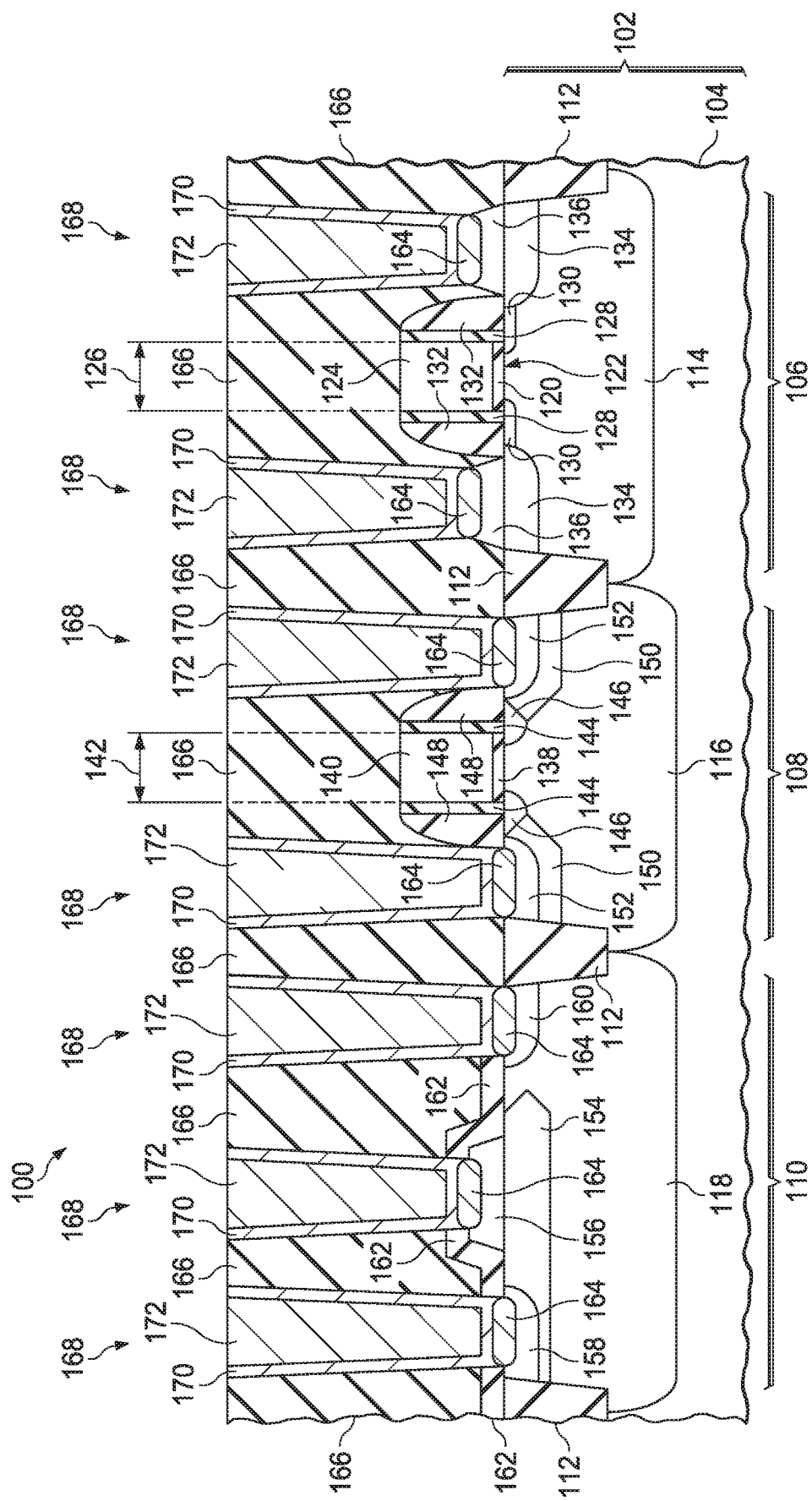
FIG. 1 is a cross section of an example integrated circuit containing an n-channel metal oxide semiconductor transistor, a p-channel metal oxide semiconductor transistor, and an NPN heterojunction bipolar transistor.

FIG. 1 is a cross section of an example integrated circuit containing an NMOS transistor, a PMOS transistor, and an NHBT. The integrated circuit 100 is formed in and on a substrate 102, for example a bulk silicon wafer, a silicon wafer with an epitaxial layer, a silicon-on-insulator (SOI) wafer, a hybrid orientation technology (HOT) wafer with regions of different crystal orientations, or other material appropriate for fabrication of the integrated circuit 100. The substrate 102 comprises silicon semiconductor material 104 which may be p-type with a doping density of $10^{15}$ cm$^{-3}$ to $10^{16}$ cm$^{-3}$. The integrated circuit 100 includes the NMOS transistor 106, the PMOS transistor 108 and the NHBT 110. Field oxide 112 is formed in the substrate 102 to laterally isolate the NMOS transistor 106, the PMOS transistor 108 and the NHBT 110. The NMOS transistor 106 is formed in a p-type well 114 in the substrate 102. The PMOS transistor 108 is formed in an n-type well 116 in the substrate 102. The NHBT 110 is formed in an n-type well 118 which provides a collector 118 for the NHBT 110. The collector 118 may be formed concurrently with the n-type well 116 containing the PMOS transistor 108.

The NMOS transistor 106 includes a gate dielectric layer 120 formed at a top surface 122 of the substrate 102, and a gate 124 formed on the gate dielectric layer 120. The gate dielectric layer 120 may be primarily thermal oxide or may include high-k dielectric material such as hafnium oxide. The gate 124 may include polycrystalline silicon, referred to as polysilicon, may include metal silicide as in a fully silicided (FUSI) gate, or may include metal layers as in a metal replacement gate. A width 126 of the gate 124, referred to as the physical gate length 126, may be less than 30 nanometers. The NMOS transistor 106 may include optional offset spacers 128 on lateral surfaces of the gate 124, such as thermal oxide and deposited silicon dioxide and/or silicon nitride, 10 nanometers to 50 nanometers thick. The NMOS transistor 106 includes n-type lightly doped drain (NLDD) extensions 130 formed in the substrate 102 adjacent to, and partly underlapping, the gate 124. The NMOS transistor 106 includes sidewall spacers 132 formed adjacent to the gate 124; the sidewall spacers 132 may include one or more layers of silicon dioxide and/or silicon nitride, and may be 30 nanometers to 75 nanometers thick. The NMOS transistor 106 includes n-type source and drain regions 134 formed in the substrate 102 adjacent to the gate 124 and partly underlapping the sidewall spacers 132. In the instant example, the NMOS transistor 106 includes NRSD layers 136. Formed by epitaxial growth on the source and drain regions 134 adjacent to the sidewall spacers 132. The NRSD layers 136 may be silicon doped with phosphorus at more than $10^{20}$ cm$^{-3}$. The sidewall spacers 132 may provide desired lateral separation between the gate 124 and the source and drain regions 134 and between the gate 124 and the NRSD layers 136.

The PMOS transistor 108 includes a gate dielectric layer 138 formed at the top surface 122 of the substrate 102, and a gate 140 formed on the gate dielectric layer 120. The gate 140 may include polysilicon, metal silicide, or may metal layers. A physical gate length 142 of the gate 140 may be less than 30 nanometers. The PMOS transistor 108 may include optional offset spacers 144 on lateral surfaces of the gate 140. The PMOS transistor 108 includes p-type lightly doped drain (PLDD) extensions 146 formed in the substrate 102 adjacent to, and partly underlapping, the gate 140. The PMOS transistor 108 includes sidewall spacers 148 formed adjacent to the gate 140; at least part of the sidewall spacers 148 may be formed concurrently with the sidewall spacers 132 of the NMOS transistor 106. In the instant example, the PMOS transistor 108 includes p-type silicon-germanium (SiGe) stressors 150 formed by epitaxial growth in the substrate 102 adjacent to, and partly underlapping, the gate 140. The PMOS transistor 108 includes p-type source and drain regions 152 in the SiGe stressors 150 adjacent to the gate 140.

The NHBT 110 includes the n-type collector 118, a p-type SiGe base 154 of SiGe formed epitaxially in the substrate 102 and an n-type emitter 156 of phosphorus-doped silicon formed epitaxially on the SiGe base 154. In the instant example, the SiGe base 154 has a same thickness, a same germanium concentration distribution and a same boron doping distribution as the SiGe stressors 150 of the PMOS transistor 108, outside of the p-type source and drain regions 152. In the instant example, the emitter 156 has a same thickness and a same phosphorus doping distribution as the NRSD layers 136 of the NMOS transistor 106. The NHBT 110 may optionally include a p-type base contact region 158 formed in the SiGe base 154 concurrently with the p-type source and drain regions 152 of the PMOS transistor 108. The NHBT 110 may optionally include an n-type collector contact region 160 formed in the collector 118 concurrently with the n-type source and drain regions 134 of the NMOS transistor 106.

The integrated circuit 100 has a silicide block layer 162 of silicon dioxide and/or silicon nitride over the top surface 122 of the substrate 102 in the NHBT 110. The silicide block layer 162 exposes the emitter 156, the base contact region 158 and the collector contact region 160. Metal silicide 164 is formed on exposed semiconductor material in the emitter 156, the base contact region 158 and the collector contact region 160 of the NHBT 110, the p-type source and drain regions 152 in the PMOS transistor 108, and the NRSD layers 136 of the NMOS transistor 106. The metal silicide 164 may include, for example, nickel silicide. A pre-metal dielectric (PMD) layer 166 is formed over an existing top surface of the integrated circuit 100, including over the NMOS transistor 106, the PMOS transistor 108 and the NHBT 110. The PMD layer 166 may include a silicon nitride or silicon dioxide PMD liner 10 to 100 nanometers thick deposited by plasma enhanced chemical vapor deposition (PECVD), a layer of silicon dioxide, phosphorus silicate glass (PSG) or boron phosphorus silicate glass (BPSG), commonly 100 to 1000 nanometers thick deposited by PECVD, commonly leveled by a chemical-mechanical polish (CMP) process, and an optional PMD cap layer, commonly 10 to 100 nanometers of a hard material such as silicon nitride, silicon carbide nitride or silicon carbide. Contacts 168 are formed through the PMD layer 166 to make electrical connections to the metal silicide 164. Each contact 168 may include a contact liner 170 comprising titanium and a contact fill metal 172 comprising tungsten.

The NHBT 110 may advantageously enable higher frequency operation for a circuit than the NMOS transistor 106 and the PMOS transistor 108. Integrating the NHBT 110 in the integrated circuit 100 with the NMOS transistor 106 and the PMOS transistor 108 may advantageously provide a lower cost product than a similar product using one integrated circuit with NMOS and PMOS transistors and a semiconductor device with an NHBT.

Figure 2A:
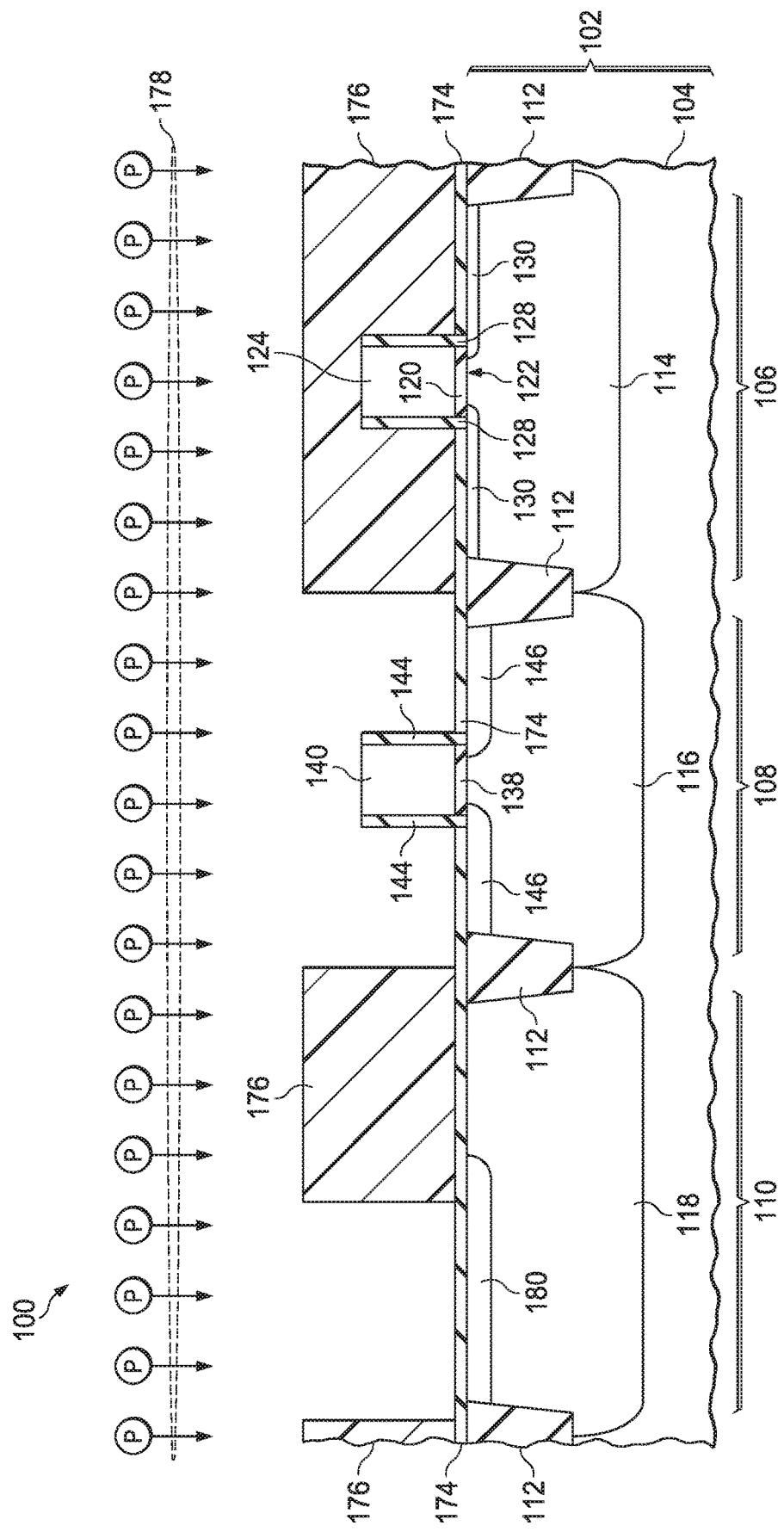
FIG. 2A through FIG. 2M are cross sections of the integrated circuit of FIG. 1, depicted in successive stages of fabrication.

FIG. 2A through FIG. 2M are cross sections of the integrated circuit of FIG. 1, depicted in successive stages of fabrication. Referring to FIG. 2A, the integrated circuit 100 is formed in and on the substrate 102. The field oxide 112 is formed in the substrate 102, for example by a shallow trench isolation (STI) process. In an STI process, trenches, commonly 200 to 500 nanometers deep, are etched into the substrate 102, surfaces of the trenches are electrically passivated, commonly by growing a thermal oxide layer on sidewalls of the trenches, and the trenches are subsequently filled with insulating material, typically silicon dioxide, for example by a high density plasma (HDP) process or an ozone based thermal chemical vapor deposition (CVD) process, also known as the high aspect ratio process (HARP). The p-type well 114 is formed by implanting p-type dopants such as boron into the substrate 102, followed by an anneal operation, for example in a rapid thermal processor (RTP) tool. The p-type dopants may be implanted in several doses at different energies to provide a desired dopant distribution in the p-type well 114. Similarly, the n-type well 116 and the collector 118 are formed by implanting n-type dopants such as phosphorus, and possibly arsenic, into the substrate 102 followed by an anneal operation. The n-type well 116 and the collector 118 may be formed concurrently. The anneal operation for the n-type well 116 and the collector 118 may be the anneal operation for the p-type well 114.

The gate dielectric layer 120 of the NMOS transistor 106 and the gate dielectric layer 138 of the PMOS transistor 108 are formed at the top surface 122 of the substrate 102, possibly partly or completely concurrently. The gate 124 of the NMOS transistor 106 and the gate 140 of the PMOS transistor 108 formed on the gate dielectric layer 120 and the gate dielectric layer 138, respectively. In one version of the instant example, the gate dielectric layers 120 and 138 may be formed by a process including thermal oxidation. In another version, the gate dielectric layers 120 and 138 may be formed by replacing thermal oxide with high-k dielectric material. In one version of the instant example, the gates 124 and 140 may be formed by patterning polysilicon, and metal silicide may be formed on the polysilicon. In another version, the gates 124 and 140 may be formed by patterning polysilicon and converting the polysilicon to metal silicide, forming FUSI gates. In a further version, the gates 124 and 140 may be formed by patterning polysilicon and replacing the polysilicon with metal layers including work function layers and barrier layers, forming metal replacement gates. Initial sublayers of the offset spacers 128 and 144 may be formed by thermal oxidation of polysilicon in the gates 124 and 140, respectively. Additional sublayers of the offset spacers 128 and 144 may include silicon dioxide and silicon nitride, formed as conformal layers over the gates 124 and 140 and subsequently etched in an anisotropic process such as a reactive ion etch (ME) process, leaving the additional sublayers.

The NLDD extensions 130 are formed by implanting n-type dopants such as phosphorus and arsenic, and possibly antimony, into the substrate 102 adjacent to the gate 124 after the offset spacers 128 are formed. Diffusion suppressant species such as carbon and fluorine may be implanted into the substrate 102 with the n-type dopants top provide desired dopant distributions in the NLDD extensions 130. The offset spacers 128 may provide desired lateral offset of the NLDD extensions 130 relative to the gate 124.

A pad oxide layer 174 may be formed over the top surface of the substrate 102 by deposition and/or thermal oxidation. A PLDD mask 176 is formed over the integrated circuit 100 so as to expose the PMOS transistor 108. The PLDD mask 176 may optionally expose an area for the SiGe base 154 of FIG. 1 of the NHBT 110. P-type dopants 178 including boron, possibly in the form of $BF_2$ or carborane, are implanted into the substrate 102 in areas exposed by the PLDD mask 176 to form the PLDD extensions 146 adjacent to the gate 140 of the PMOS transistor 108. Carbon and/or fluorine may be implanted with the p-type dopants 178 to provide desired dopant distributions in the PLDD extensions 146. The offset spacers 144 may provide desired lateral offset of the PLDD extensions 146 relative to the gate 140. If the PLDD mask 176 exposes the area for the SiGe base 154 of the NHBT 110, the p-type dopants 178 are implanted into the substrate 102 to form a base doped region 180 which has a "tail" of dopants extending downward into the collector 118. The tail of dopants may provide a desired counter-doping of the collector 118 at a base-collector junction of the NHBT 110. Forming the tail of dopants concurrently with the PLDD extensions 146 may advantageously reduce fabrication cost and complexity of the integrated circuit 100. The PLDD mask 176 is subsequently removed, for example by an ash process followed by a wet clean process.

Figure 2B:
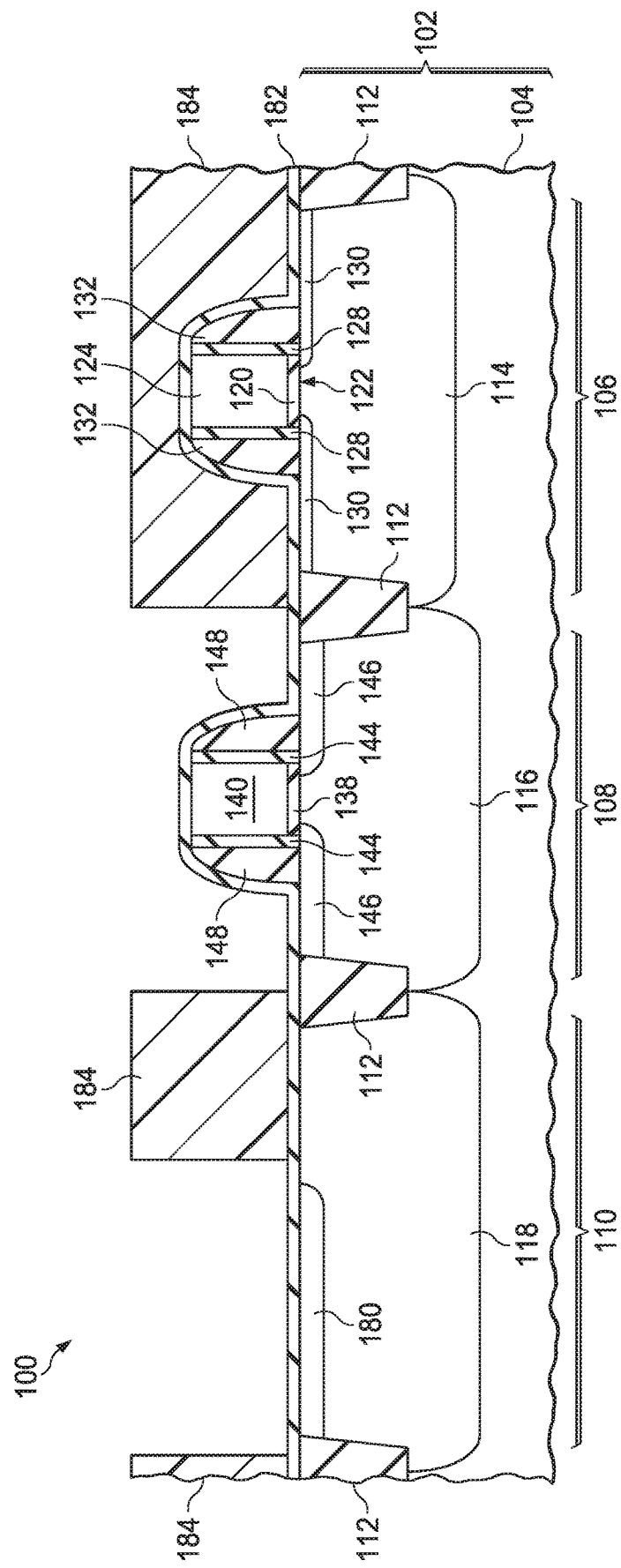

Referring to FIG. 2B, the sidewall spacers 132 and 148 are formed adjacent to the gate 124 of the NMOS transistor 106, and the gate 140 of the PMOS transistor 108, respectively. The sidewall spacers 132 and 148 may be formed by depositing conformal layers of silicon nitride and/or silicon dioxide, followed by an anisotropic etch which removes the conformal layers from tops of the gates 124 and 140 the substrate 102. A SiGe mask layer 182 is formed over the integrated circuit 100. The SiGe mask layer 182 may include one or more layers of silicon nitride, silicon dioxide, silicon oxynitride, boron nitride or other dielectric material. The SiGe mask layer 182 may be 10 nanometers to 50 nanometers thick. A SiGe etch mask 184 is formed over the SiGe mask layer 182 so as to expose the SiGe mask layer 182 over the PMOS transistor 108 and cover the SiGe mask layer 182 over the NMOS transistor 106. In the instant example, the SiGe etch mask 184 is formed so as to also expose the SiGe mask layer 182 over the NHBT 110. The SiGe etch mask 184 may include photoresist formed by a photolithographic process, and may also include an anti-reflection layer and/or a hard mask layer.

Figure 2C:
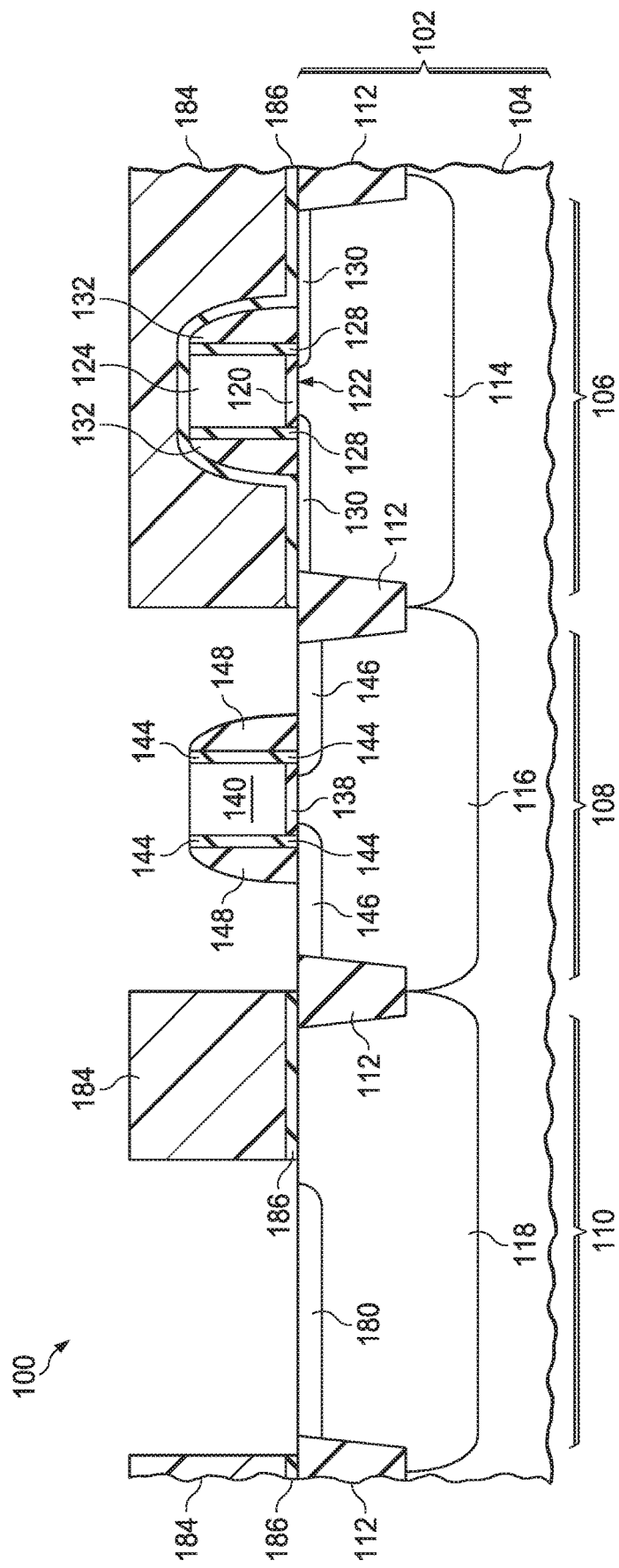

Referring to FIG. 2C, the SiGe mask layer 182 of FIG. 2B is removed in areas exposed by the SiGe etch mask 184 so as to form a SiGe epitaxy mask 186 which exposes the PMOS transistor 108 and a portion of the NHBT 110, and covers the NMOS transistor 106. The SiGe mask layer 182 may be removed by an ash process or a plasma etch which is selective to the substrate 102. If the gate 140 of the PMOS transistor 108 includes polysilicon, a gate cap layer, not shown, may be used to protect the polysilicon during subsequent processing.

Figure 2D:
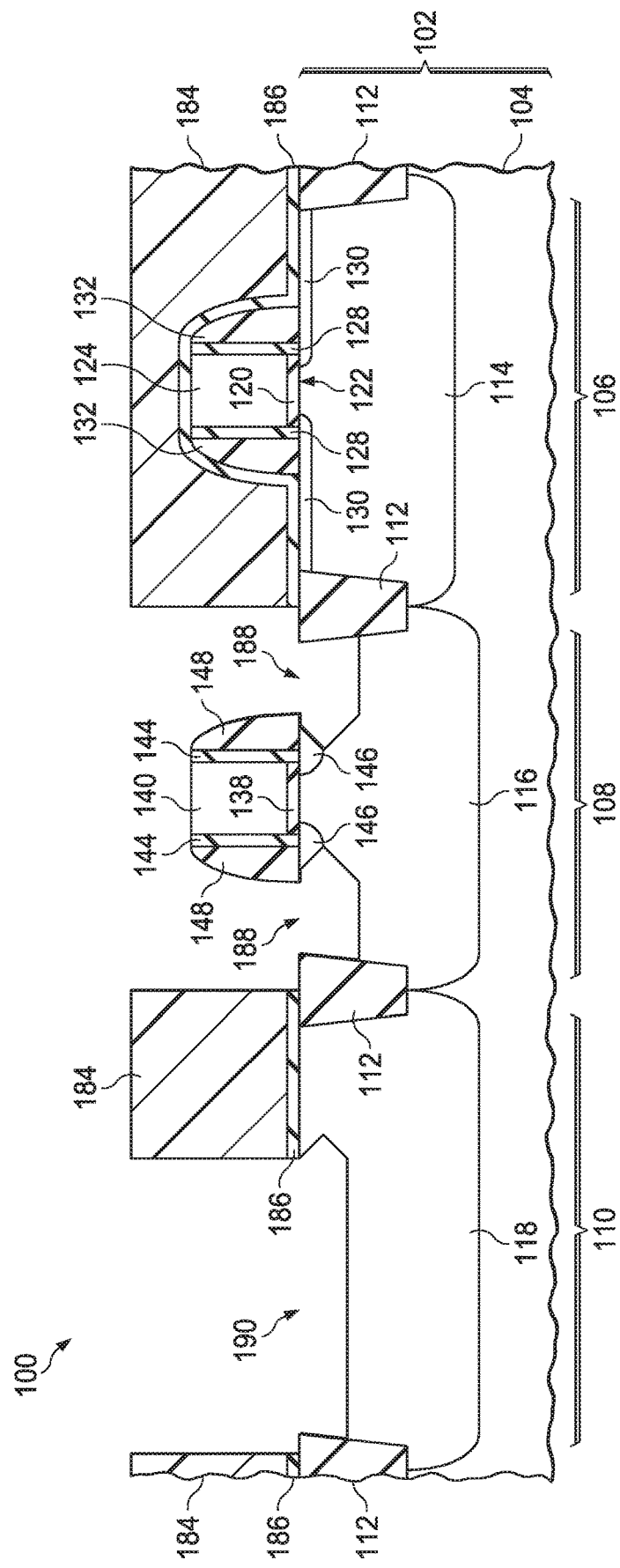

Referring to FIG. 2D, semiconductor material is removed from the substrate 102 exposed by the SiGe epitaxy mask 186 so as to form source/drain cavities 188 adjacent to the gate 140 of the PMOS transistor 108 and to concurrently form a base cavity 190 in the NHBT 110. The source/drain cavities 188 and the base cavity 190 may be, for example, 10 nanometers to 70 nanometers deep. The source/drain cavities 188 and the base cavity 190 may be formed with a dry etch followed by a wet etch of ammonium hydroxide or tetramethyl ammonium hydroxide to form facets on crystallographic planes of the semiconductor material of the substrate 102, as depicted in FIG. 2D. The SiGe epitaxy mask 186 and the SiGe etch mask 184 prevent semiconductor material removal from the NMOS transistor 106. The SiGe etch mask 184 is removed, for example by an ash process followed by a wet clean process.

Figure 2E:
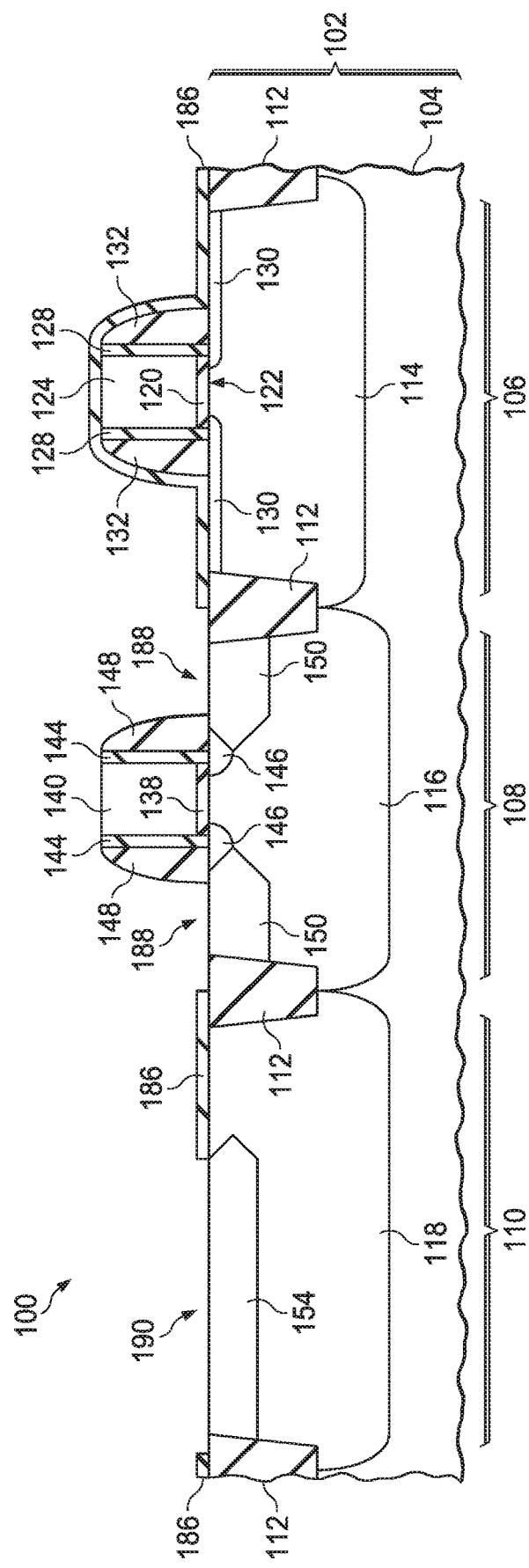

Referring to FIG. 2E, a pre-clean process prepares the semiconductor material of the substrate 102 exposed in the source/drain cavities 188 and the base cavity 190 for a subsequent epitaxial process. The pre-clean process may include a wet etch in a dilute aqueous solution of hydrofluoric acid followed by a bake at a temperature of 900° C. to 950° C. in a hydrogen ambient. SiGe semiconductor material is formed by an epitaxial process in the source/drain cavities 188 and the base cavity 190 to form the SiGe stressors 150 adjacent to the gate 140 of the PMOS transistor 108 and to form the SiGe base 154 of the NHBT 110. Forming the SiGe base 154 concurrently with the SiGe stressors 150 may advantageously reduce fabrication cost and complexity of the integrated circuit 100. The epitaxial process may use silane ($SiH_4$) or dichlorosilane ($SiH_2Cl_2$) and germane ($GeH_4$) at 550° C. to 650° C. and a pressure of 10 torr to 40 torr. Diborane ($B_2H_6$) may be used in the epitaxial process to dope the SiGe stressors 150 and the SiGe base 154. The epitaxial process may start by growing a low doped or undoped nucleation layer with a low germanium concentration, say less than 10 percent, 5 nanometers to 10 nanometers thick, to provide uniform nucleation on the semiconductor material in the source/drain cavities 188 and the base cavity 190. The epitaxial process may end by growing a cap layer, 5 nanometers to 10 nanometers thick, which has a low germanium concentration, say less than 10 percent, to enhance subsequent silicide formation. In one version of the instant example, the SiGe stressors 150 and the SiGe base 154 may have a substantially uniform distribution of germanium with an average germanium concentration of 25 percent to 35 percent between the nucleation layer and the cap layer. In another version, the flows of silane, dichlorosilane and germane may be varied during the epitaxial process so that the germanium concentration varies from about 25 percent proximate to bottoms of the SiGe stressors 150 and the SiGe base 154 to about 60 percent proximate to tops of the SiGe stressors 150 and the SiGe base 154. The SiGe epitaxy mask 186 prevents SiGe growth on the NMOS transistor 106.

Figure 2F:
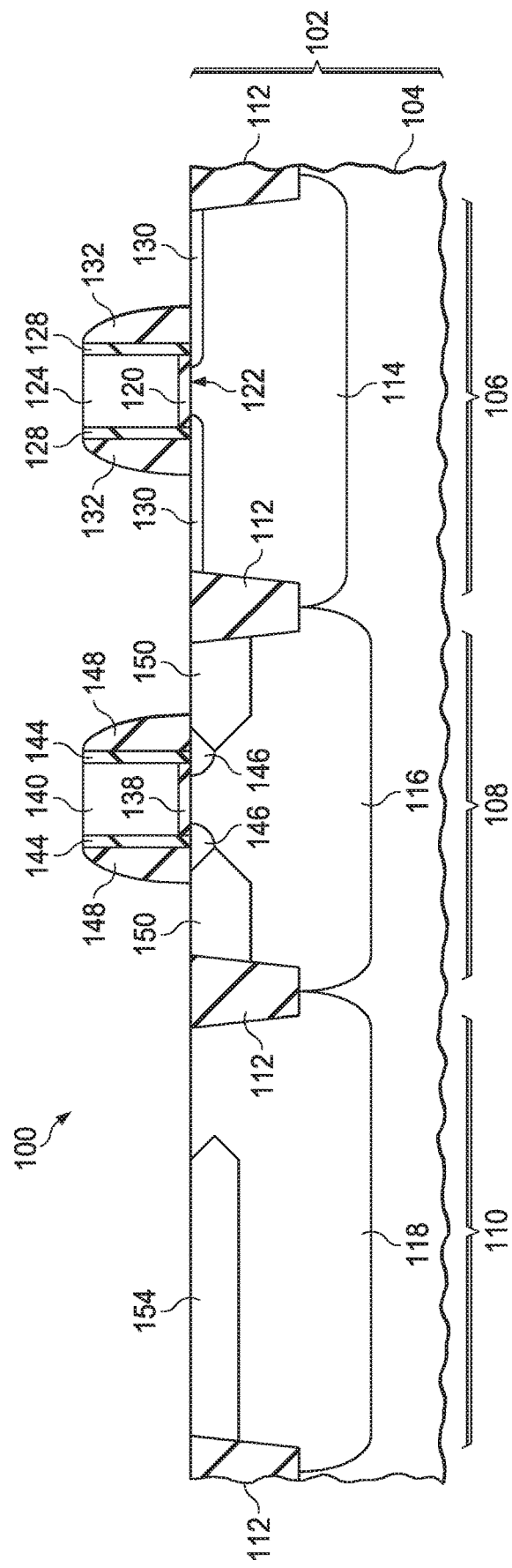

Referring to FIG. 2F, the SiGe epitaxy mask 186 of FIG. 2E is removed, for example using a plasma etch process which is selective to the SiGe in the SiGe stressors 150 and the SiGe base 154 and to the semiconductor material of the substrate 102. A pad oxide layer, not shown, may be formed over the substrate 102 to protect the top surface 122 of the substrate 102 during subsequent processing.

Figure 2G:
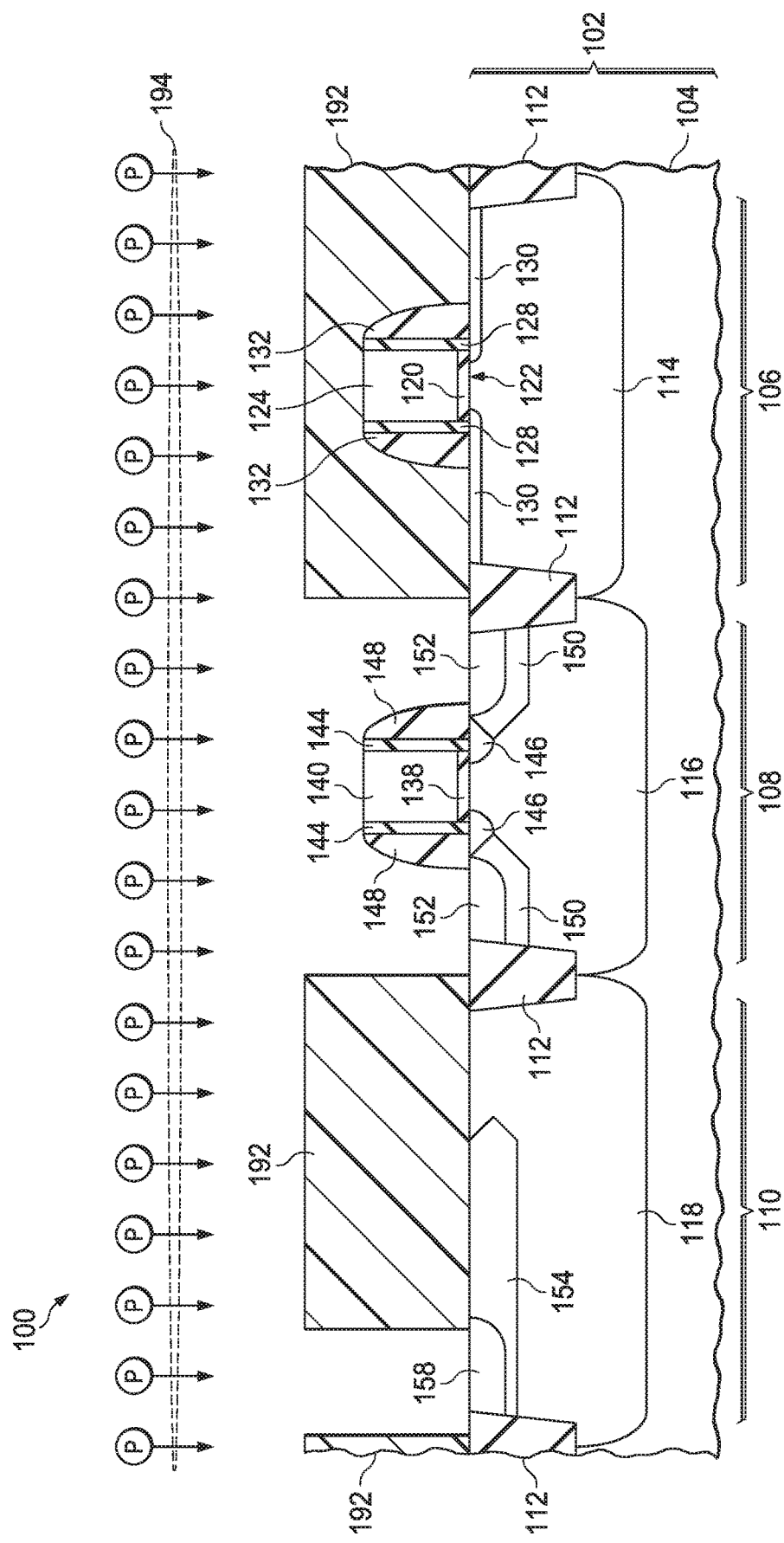

Referring to FIG. 2G, a p-channel source/drain (PSD) mask 192 is formed over the integrated circuit 100 so as to expose the PMOS transistor 108 and cover the NMOS transistor 106. In the instant example, the PSD mask 192 exposes an area for the base contact region 158 in the SiGe base 154 of the NHBT 110. The PSD mask 192 may include photoresist formed by a photolithographic process. P-type dopants 194 such as boron, possibly in the form of $BF_2$ or carborane, are implanted into the SiGe stressors 150 to form the p-type source and drain regions 152, and into the SiGe base 154 to form the base contact region 158. The p-type dopants 194 may be implanted a dose of $10^{14}$ cm$^{-2}$ to $10^{16}$ cm$^{-2}$. The PSD mask 192 is removed after the p-type dopants 194 are implanted, for example using an ash process followed by a wet clean process. A subsequent anneal activates the implanted p-type dopants 194.

Figure 2H:
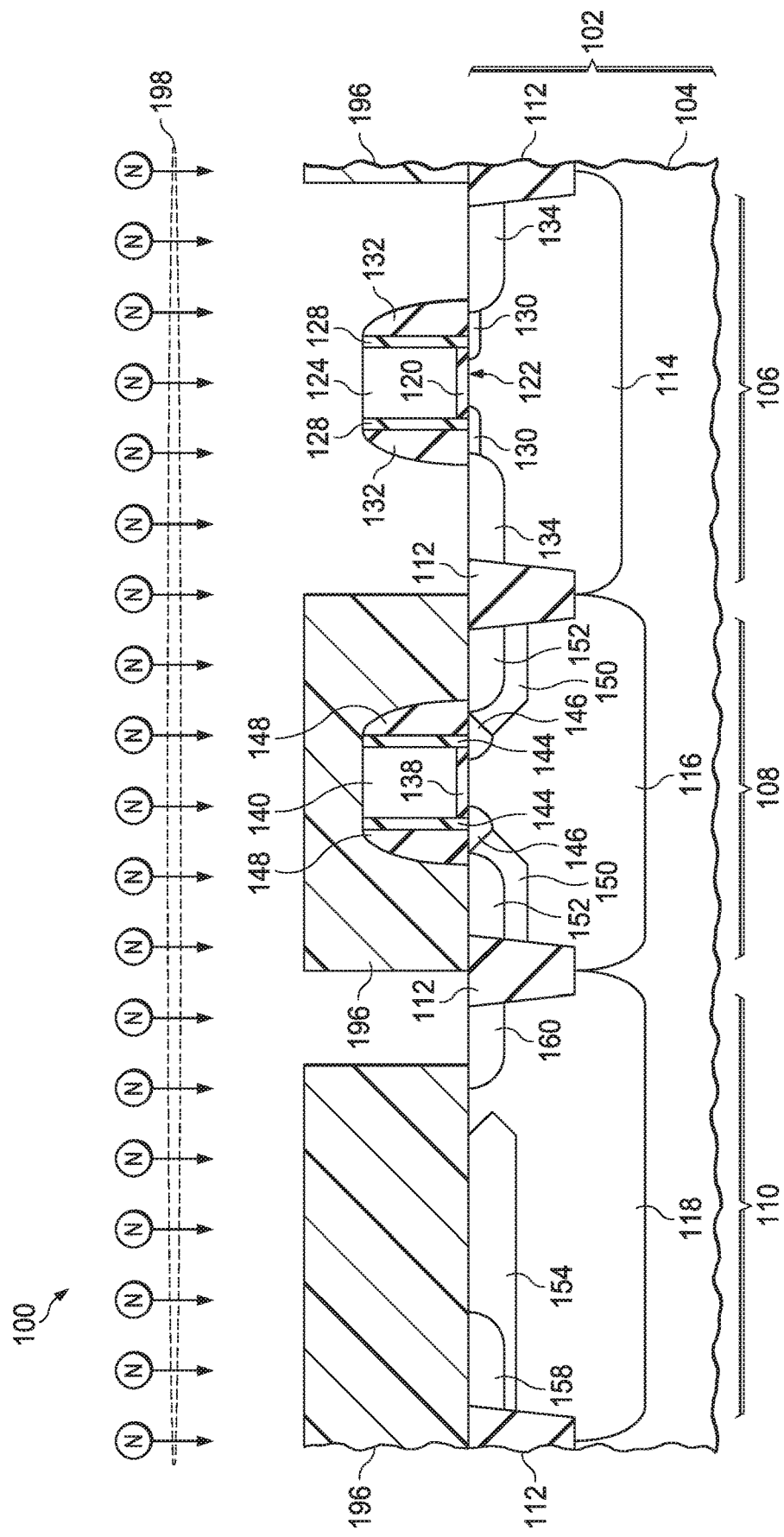

Referring to FIG. 2H, an n-channel source/drain (NSD) mask 196 is formed over the integrated circuit 100 so as to expose the NMOS transistor 106 and cover the PMOS transistor 108. In the instant example, the NSD mask 196 exposes an area for the n-type collector contact region 160 in the collector 118 of the NHBT 110. The NSD mask 196 may be formed similarly to the PSD mask 192 of FIG. 2G. N-type dopants 198 such as phosphorus and arsenic, and possibly antimony, are implanted into the substrate 102 adjacent to the sidewall spacers 132 of the NMOS transistor 106 to form the n-type source and drain regions 134, and into the collector 118 to form the n-type collector contact region 160. The n-type dopants 198 may be implanted a dose of $10^{14}$ cm$^{-2}$ to $10^{16}$ cm$^{-2}$. The NSD mask 196 is removed after the n-type dopants 198 are implanted, for example using a process similar to that used to remove the PSD mask 192. A subsequent anneal activates the implanted n-type dopants 198. The anneal to activate the n-type dopants 198 may be done concurrently with the anneal to activate the p-type dopants 194 of FIG. 2G.

Figure 2I:
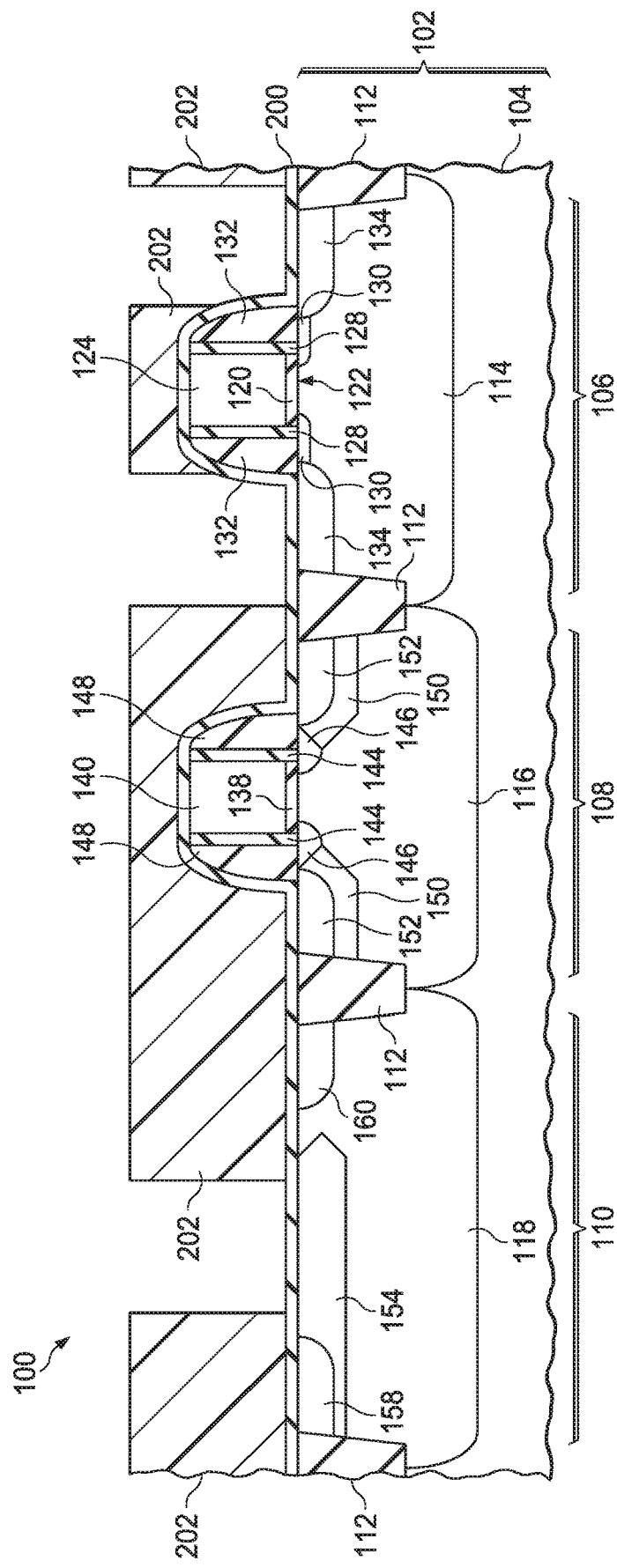

Referring to FIG. 2I, an NRSD mask layer 200 is formed over the integrated circuit 100. The NRSD mask layer 200 may have a similar structure and composition to the SiGe mask layer 182 of FIG. 2B and may be formed using similar processes. An NRSD etch mask 202 is formed over the NRSD mask layer 200 so as to expose the NRSD mask layer 200 over the source and drain regions 134 of the NMOS transistor 106 and in an area for the emitter 156 of FIG. 1 in the NHBT 110. The NRSD etch mask 202 may optionally cover the gate 124 of the NMOS transistor 106 to prevent epitaxial growth on exposed silicon in the gate 124 if present. The NRSD etch mask 202 covers the PMOS transistor 108. The NRSD etch mask 202 may have a structure similar to the SiGe etch mask 184 of FIG. 2B and may be formed using similar processes.

Figure 2J:
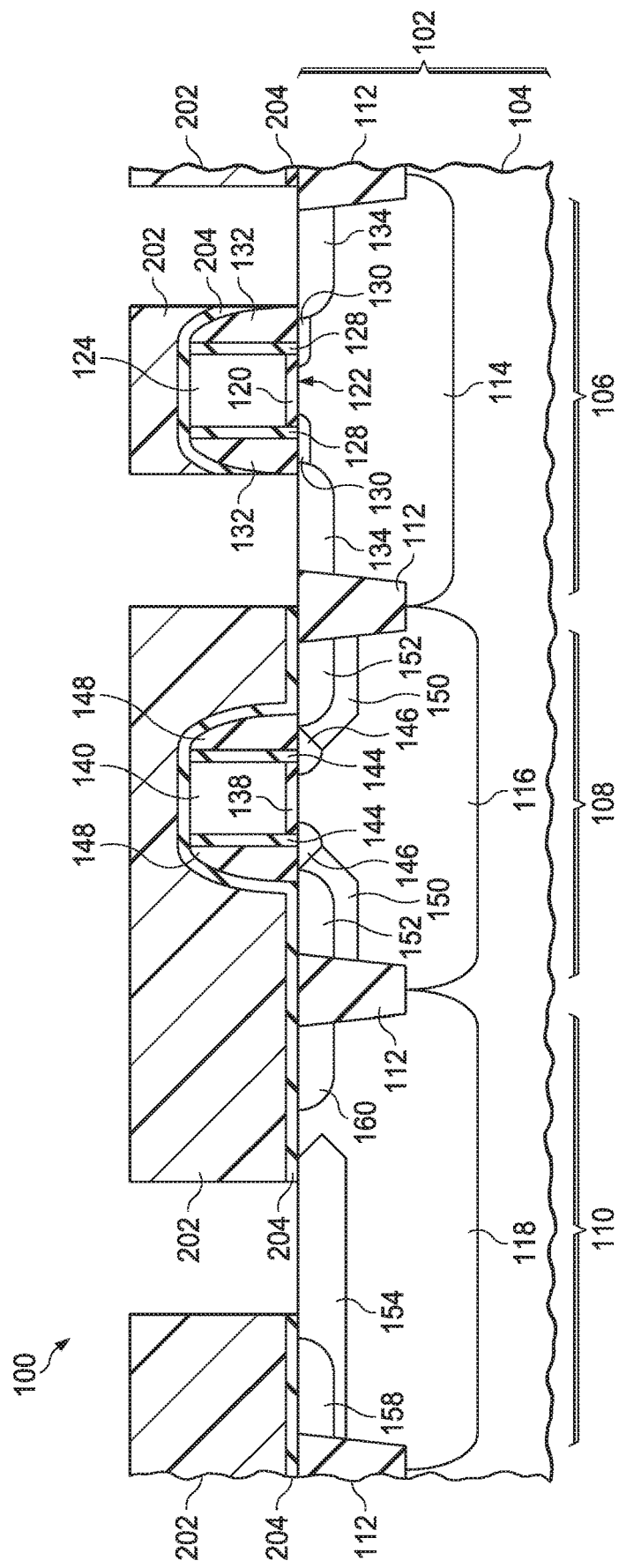

Referring to FIG. 2J, the NRSD mask layer 200 of FIG. 2I is removed in areas exposed by the NRSD etch mask 202 so as to form an NRSD mask 204 which exposes the source and drain regions 134 of the NMOS transistor 106 and the area for the emitter 156 of FIG. 1 in the NHBT 110. The NRSD mask 204 covers the PMOS transistor 108 and may cover the gate 124 of the NMOS transistor 106. The NRSD etch mask 202 is subsequently removed, for example by an ash process or a plasma etch which is selective to the substrate 102.

Figure 2K:
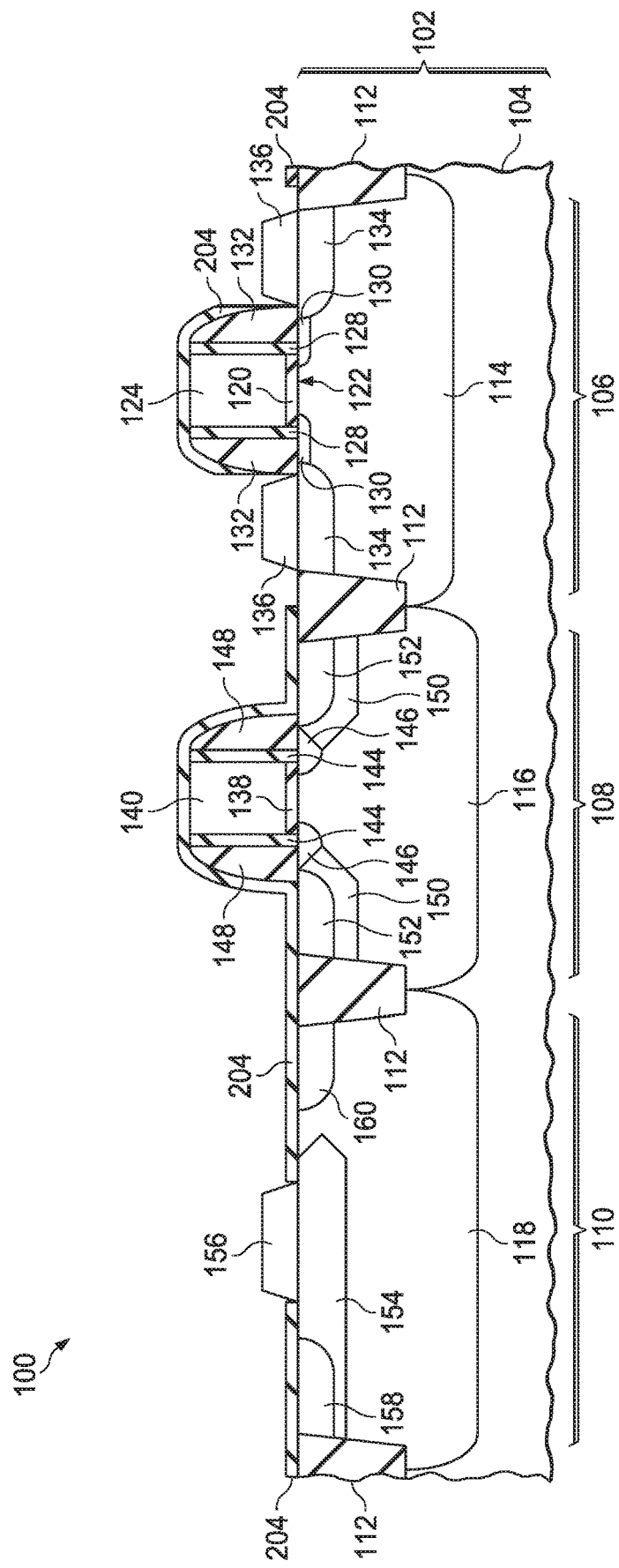

Referring to FIG. 2K, n-type doped silicon semiconductor material is formed by an epitaxial process on the source and drain regions 134 of the NMOS transistor 106 and on the SiGe base 154 in the area for the emitter 156 in the NHBT 110, to form the NRSD layers 136 of the NMOS transistor 106 and the emitter 156 of the NHBT 110. The epitaxial process may use silane and/or dichlorosilane to provide the silicon in the doped silicon semiconductor material, and may use tertiary butyl phosphine $((CH_3)_3CPH_2)$ and/or tri butyl arsine $((C_4H_7)_3As)$ to provide n-type dopants at an average density greater than $10^{20}$ cm$^{-3}$. The epitaxial process may be performed at 550° C. to 600° C. at a pressure of 100 millitorr to 500 millitorr. The NRSD mask 204 prevents epitaxial growth on the PMOS transistor 108. The NRSD mask 204 is subsequently removed, for example using a plasma etch which is selective to the exposed semiconductor materials in the integrated circuit 100.

Figure 2L:
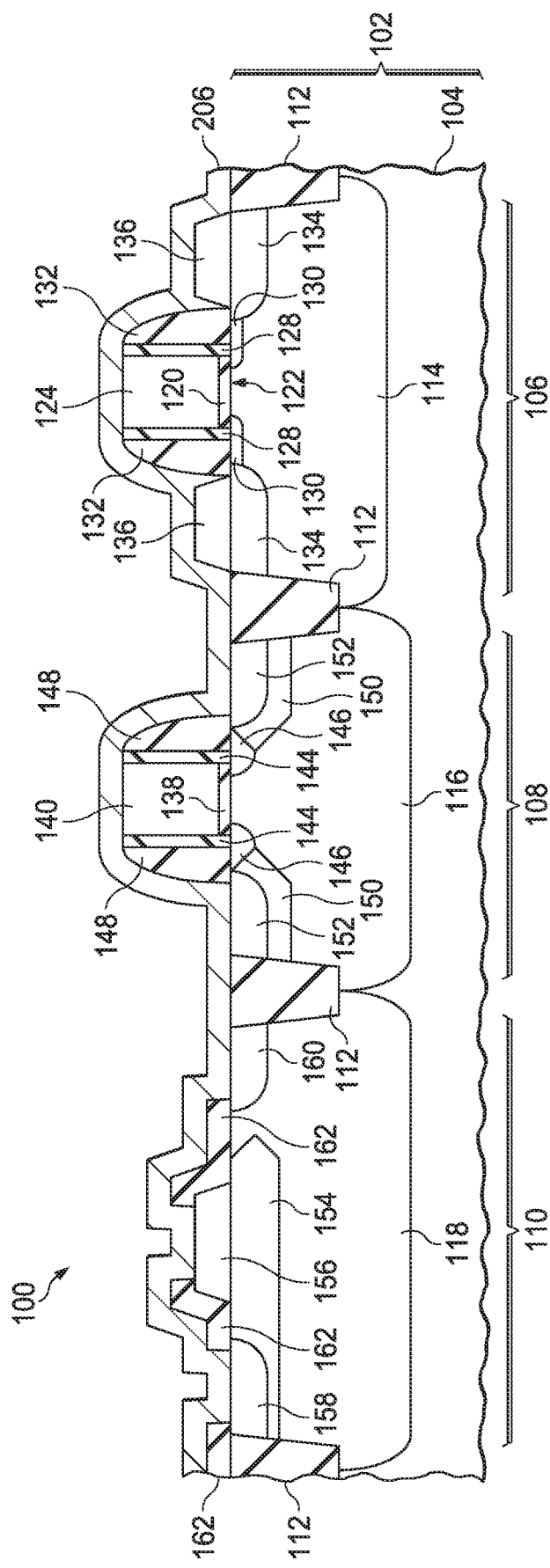

Referring to FIG. 2L, the silicide block layer 162 is formed over the NHBT 110 to prevent metal silicide from short circuiting the emitter 156, SiGe base 154 and collector 118. The silicide block layer 162 may be formed by depositing one or more conformal layers of silicon nitride and/or silicon dioxide over the integrated circuit 100, forming an etch mask of photoresist over the conformal layers, removing the conformal layers where exposed by the etch mask, and finally removing the etch mask. Exposed semiconductor material at the top surface 122 of the substrate 102 may be cleaned by an in situ two-step process such as the SiCoNi™ process from Applied Materials. A layer of refractory metal 206 such as nickel, nickel with a few percent platinum, or cobalt is formed over the integrated circuit 100, contacting exposed semiconductor material in the emitter 156, the base contact region 158 and the collector contact region 160 of the NHBT 110, the p-type source and drain regions 152 in the PMOS transistor 108, and the NRSD layers 136 of the NMOS transistor 106. A cap layer of refractor material such as titanium nitride may be formed over the layer of refractory metal 206 to assist formation of metal silicide.

Figure 2M:
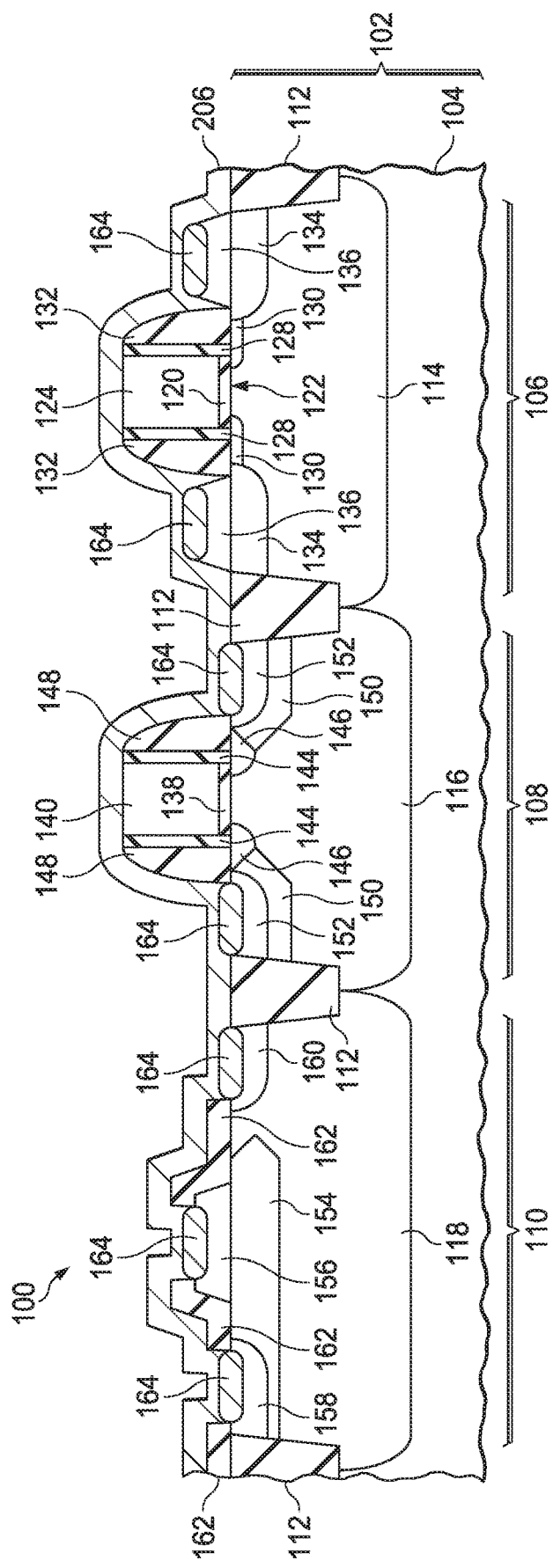

Referring to FIG. 2M, a silicide form process heats the layer of refractory metal 206 so as to react with silicon in exposed semiconductor material to form the metal silicide 164. For example, nickel silicide 164 may be formed at 250° C. to 300° C. Cobalt silicide 164 may be formed at 400° C. to 600° C. Subsequently, unreacted refractory metal in the layer of refractory metal 206 is removed, for example by a spray etch process using an aqueous mixture of sulfuric acid and hydrogen peroxide, or aqua regia. The integrated circuit 100 may subsequently be annealed at 500° C. to 700° C. to stabilize the metal silicide 164. Fabrication of the integrated circuit 100 is continued by formation of the PMD layer 166 and contacts 168 to provide the structure of FIG. 1.

Figure 3A:
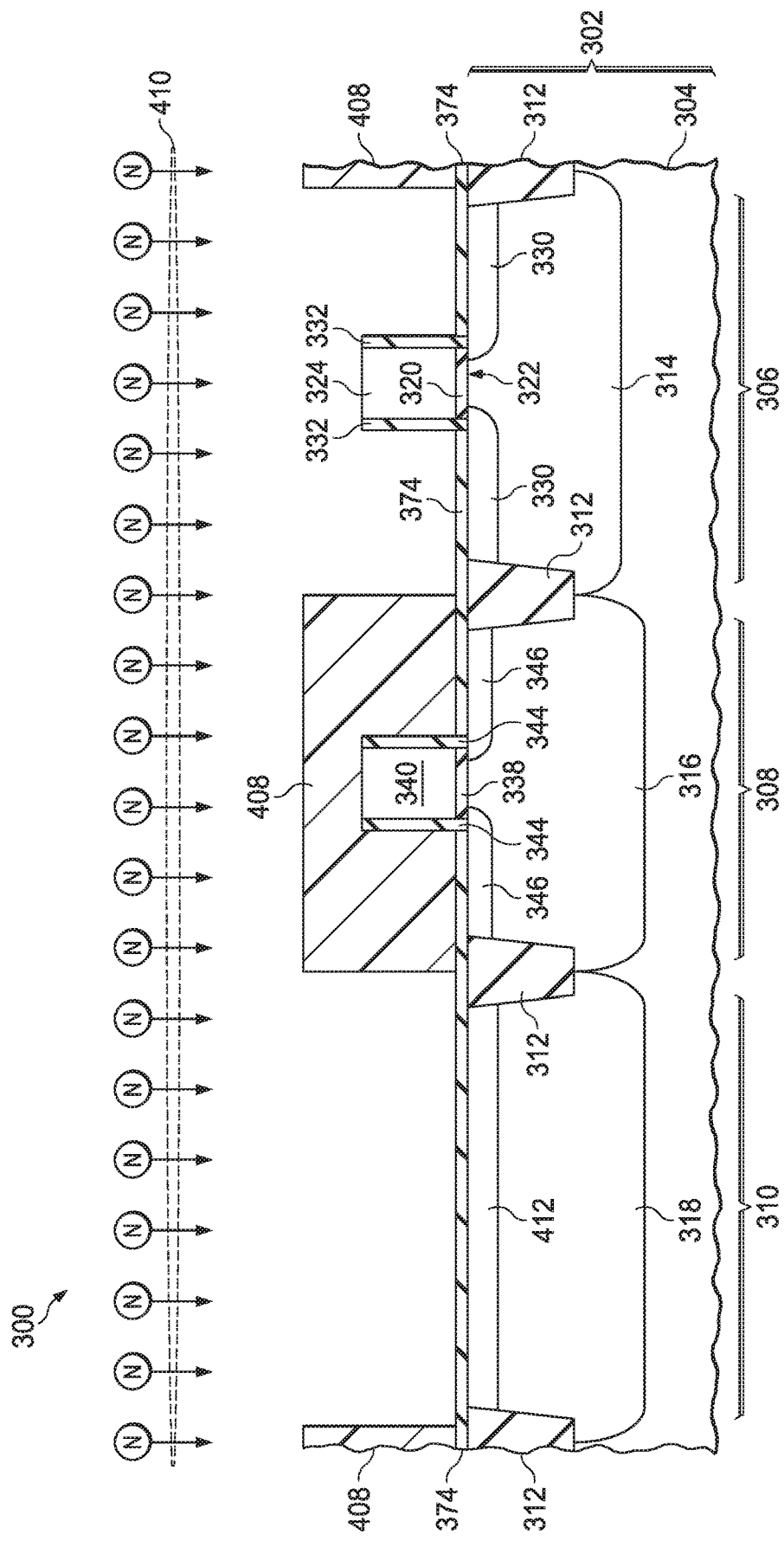
FIG. 3A through FIG. 3H are cross sections of another example integrated circuit, depicted in successive stages of fabrication.

FIG. 3A through FIG. 3H are cross sections of another example integrated circuit, depicted in successive stages of fabrication. Referring to FIG. 3A, the integrated circuit 300 is formed in and on a substrate 302 comprising silicon semiconductor material 304 as described in reference to FIG. 1. The integrated circuit 300 includes an NMOS transistor 306, a PMOS transistor 308 and an NHBT 310. Field oxide 312 is formed in the substrate 302 to laterally isolate the NMOS transistor 306, the PMOS transistor 308 and the NHBT 310. The NMOS transistor 306 is formed in a p-type well 314 in the substrate 302. The PMOS transistor 308 is formed in an n-type well 316 in the substrate 302. The NHBT 310 is formed in an n-type well 318 which provides a collector 318 for the NHBT 310. The collector 318 may be formed concurrently with the n-type well 316 containing the PMOS transistor 308. The field oxide 312, the p-type well 314, the n-type well 316 and the collector 318 may be formed as described in reference to FIG. 1.

The NMOS transistor 306 includes a gate dielectric layer 320 formed at a top surface 322 of the substrate 302, and a gate 324 formed on the gate dielectric layer 320. The NMOS transistor 306 may include optional offset spacers 328 on lateral surfaces of the gate 324. The PMOS transistor 308 includes a gate dielectric layer 338 formed at the top surface 322 of the substrate 302, and a gate 340 formed on the gate dielectric layer 320. The PMOS transistor 308 may include optional offset spacers 344 on lateral surfaces of the gate 340. The gate dielectric layer 320, the gate 324 and the offset spacers 328 of the NMOS transistor 306, and the gate dielectric layer 338, the gate 340 and the offset spacers 344 of the PMOS transistor 308 may have similar compositions and structures to those described in reference to FIG. 1 and FIG. 2A. The PMOS transistor 308 includes PLDD extensions 346 formed in the substrate 302 adjacent to, and partly underlapping, the gate 340.

A pad oxide layer 374 may be formed over the top surface of the substrate 302 by deposition and/or thermal oxidation. An NLDD mask 408 is formed over the integrated circuit 300 so as to expose the NMOS transistor 306. The NLDD mask 408 exposes the NHBT 310. N-type dopants 410 including phosphorus and arsenic, and possibly antimony, are implanted into the substrate 302 in areas exposed by the NLDD mask 408 to form NLDD extensions 330 adjacent to the gate 324 of the NMOS transistor 306. Carbon and/or fluorine may be implanted with the n-type dopants 410 to provide desired dopant distributions in the NLDD extensions 330. The offset spacers 328 may provide desired lateral offset of the NLDD extensions 330 relative to the gate 324. The n-type dopants 410 are implanted into the substrate 302 to form a n-type implanted region 412 which has a "tail" of dopants extending downward into the collector 318. The tail of dopants may provide a desired doping of the collector 318 at a base-collector junction of the NHBT 310. Forming the tail of dopants concurrently with the NLDD extensions 330 may advantageously reduce fabrication cost and complexity of the integrated circuit 300. The NLDD mask 408 is subsequently removed, for example by an ash process followed by a wet clean process.

Figure 3B:
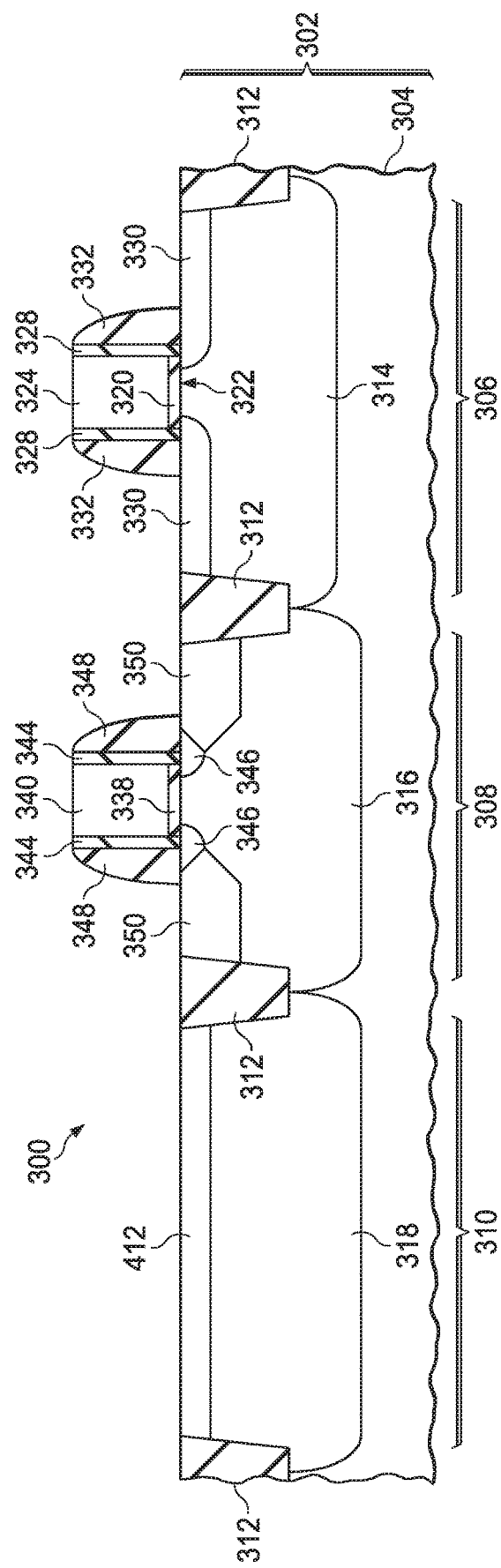

Referring to FIG. 3B, sidewall spacers 332 are formed adjacent to the gate 324 of the NMOS transistor 306, and sidewall spacers 348 are formed adjacent to the gate 340 of the PMOS transistor 308. The sidewall spacers 332 and 348 may be formed as described in reference to FIG. 2B. SiGe stressors 350 are formed in the substrate 302 adjacent to the gate 340 of the PMOS transistor 308. The SiGe stressors 350 may be formed as described in reference to FIG. 2B through FIG. 2F. In the instant example, a SiGe base of the NHBT 310 is not formed concurrently with the SiGe stressors 350.

Figure 3C:
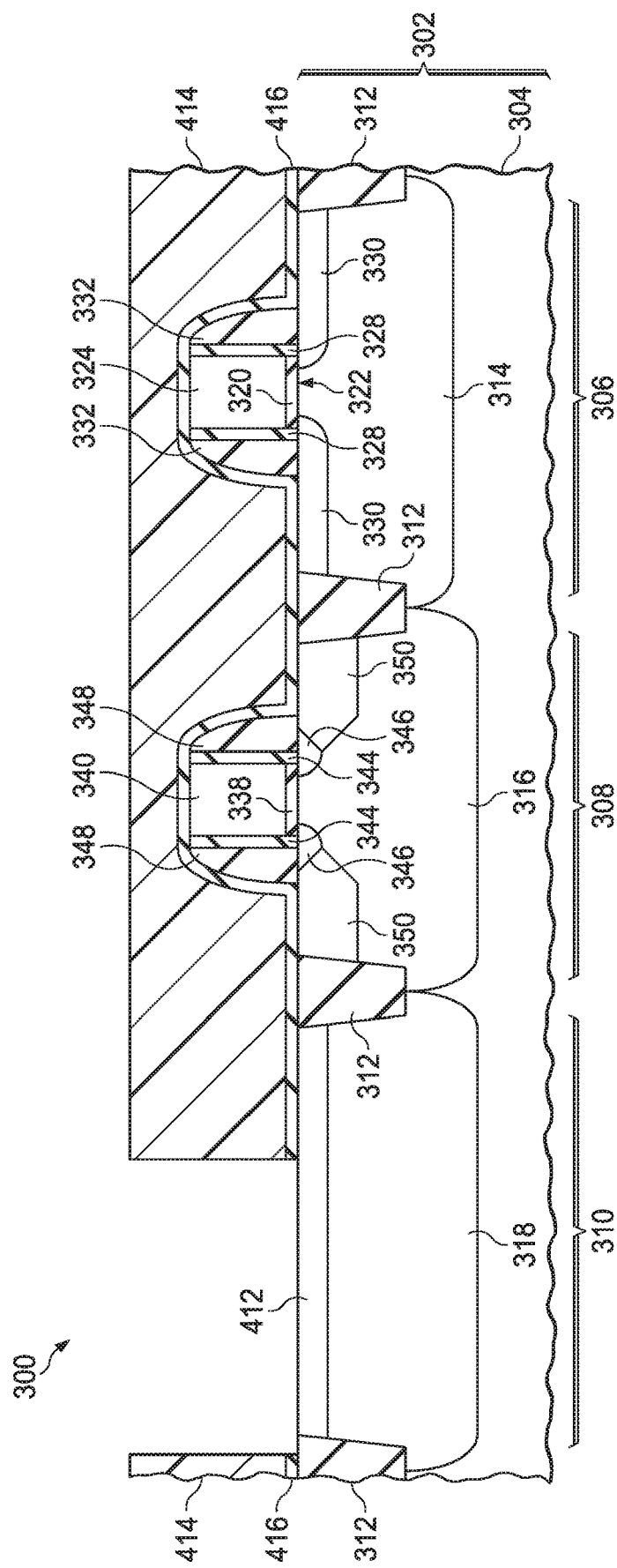

Referring to FIG. 3C, a SiGe mask layer is formed over the integrated circuit 300 and a SiGe etch mask 414 is formed over the SiGe mask layer so as to expose an area for a SiGe base of the NHBT 310. In the instant example, the SiGe etch mask 414 covers the NMOS transistor 306 and the PMOS transistor 308. The SiGe mask layer is removed where exposed by the SiGe etch mask 414 to form a SiGe epitaxy mask 416 which exposes the substrate 302 in the area for the SiGe base of the NHBT 310. The SiGe epitaxy mask 416 covers the NMOS transistor 306 and the PMOS transistor 308.

Figure 3D:
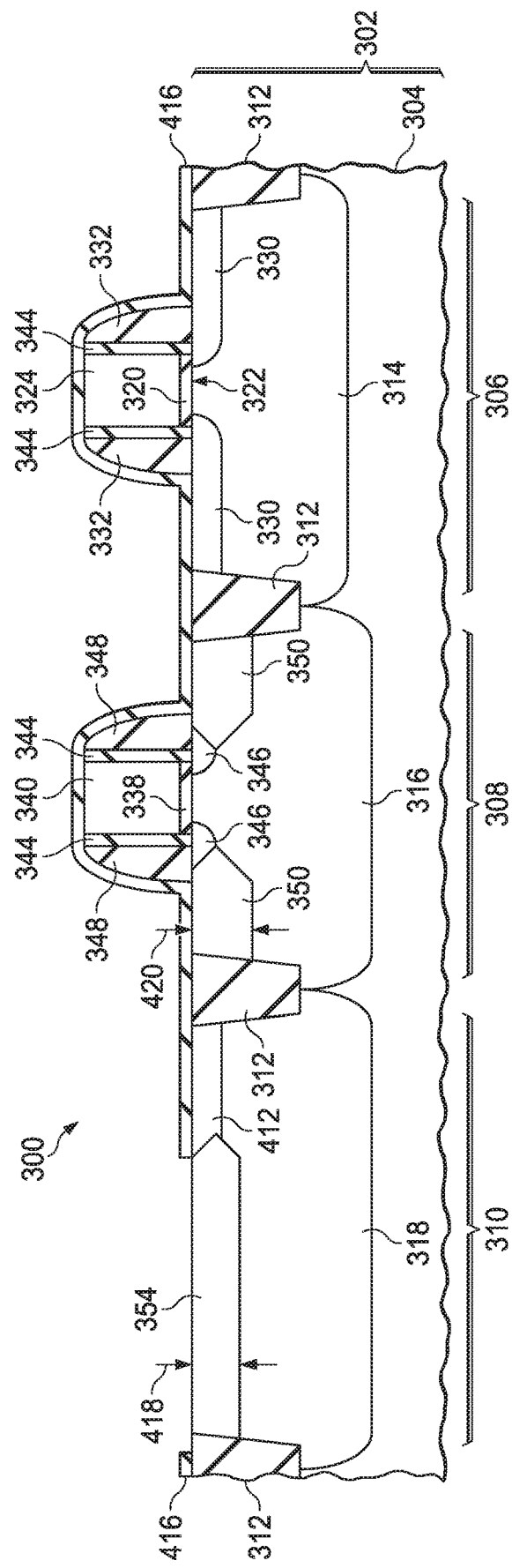

Referring to FIG. 3D, the SiGe base 354 of the NHBT 310 is formed in the area exposed by the SiGe epitaxy mask 416. In the instant example, a thickness 418 of the SiGe base 354 is at least 25 percent less than a thickness 420 of the SiGe stressors 350, which may provide enhanced higher frequency performance for the NHBT 310 compared to an NHBT with a thicker SiGe base. The SiGe base 354 may be formed as described in reference to FIG. 2D and FIG. 2E. An average germanium concentration of the SiGe base 354 may be 5 percent to 15 percent, and may be at least 10 percentage points lower than an average germanium concentration of the SiGe stressors 350, which may provide further enhanced higher frequency performance for the NHBT 310 compared to an NHBT with a higher germanium concentration in its SiGe base.

Figure 3E:
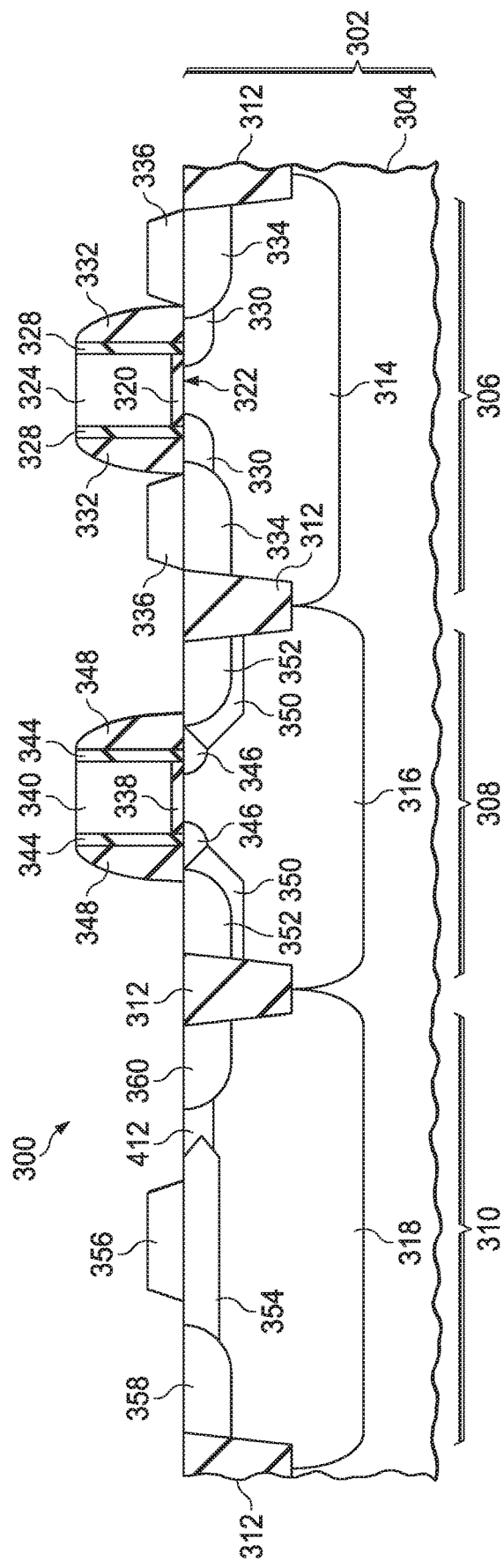

Referring to FIG. 3E, p-type source and drain regions 352 are formed in the substrate 302 adjacent to the gate 340 of the PMOS transistor 308. Concurrently, a p-type base contact region 358 is formed in the SiGe base 354 of the NHBT 310. The p-type source and drain regions 352 and the base contact region 358 may be formed as described in reference to FIG. 2G.

N-type source and drain regions 334 are formed in the substrate 302 adjacent to the gate 324 of the NMOS transistor 306. Concurrently, an n-type collector contact region 360 is formed in the collector 318 of the NHBT 310. The n-type source and drain regions 334 and the collector contact region 360 may be formed as described in reference to FIG. 2H.

NRSD layers 336 are formed on the n-type source and drain regions 334 of the NMOS transistor 306. Concurrently, an n-type emitter 356 is formed on the SiGe base 354 of the NHBT 310. The NRSD layers 336 and the n-type emitter 356 may be formed as described in reference to FIG. 2I through FIG. 2K.

Figure 3F:
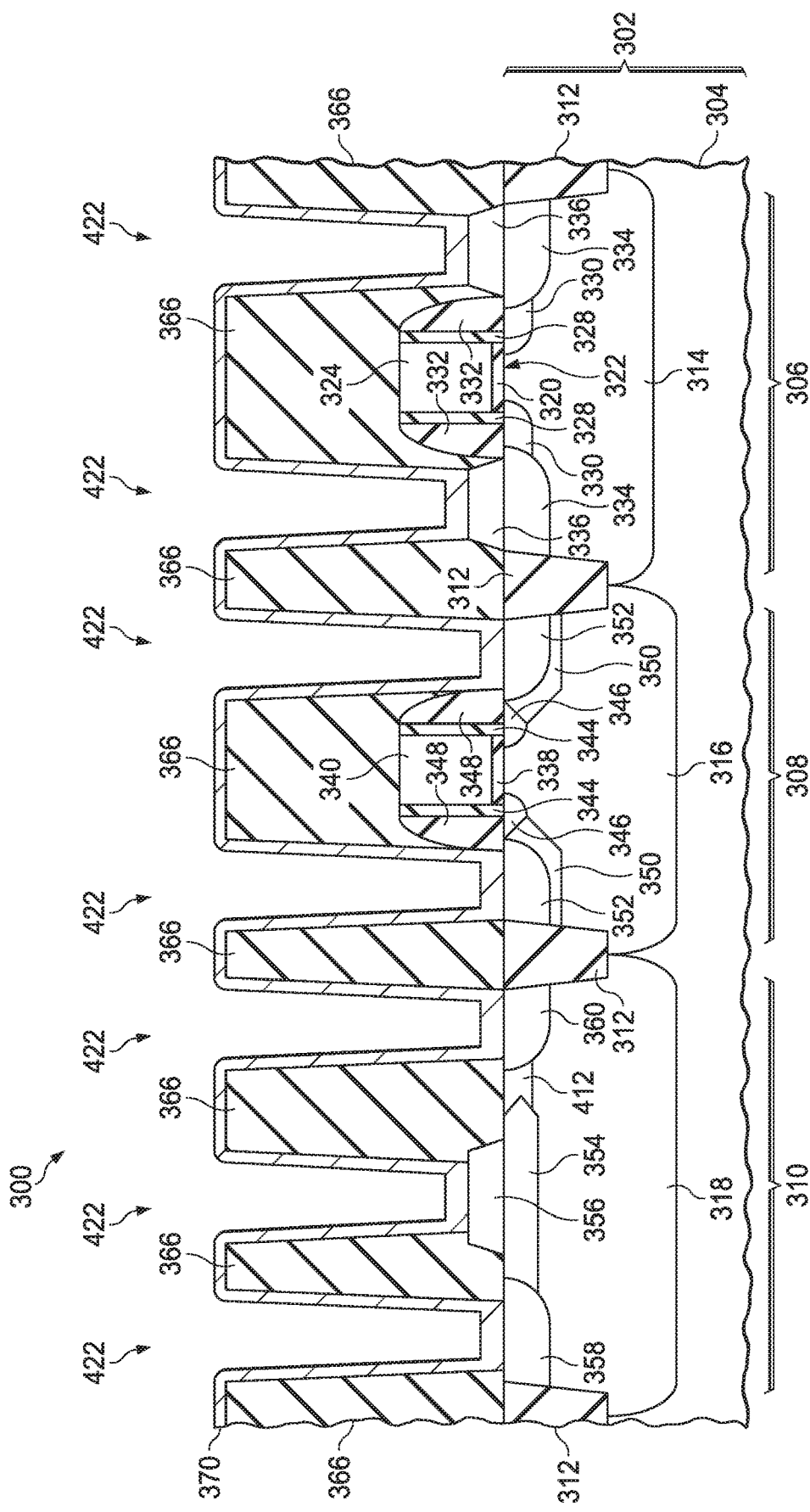

Referring to FIG. 3F, a PMD layer 366 is formed over an existing top surface of the integrated circuit 300. The PMD layer 366 may have the structure, and may be formed, as described in reference to FIG. 1. Contact holes 422 are formed through the PMD layer 366 so as to expose the emitter 356, the base contact region 358 and the collector contact region 360 of the NHBT 310, the p-type source and drain regions 352 in the PMOS transistor 308, and the NRSD layers 336 of the NMOS transistor 306. The contact holes may be formed by forming an etch mask comprising photoresist formed by a photolithographic process and hard mask layers such as silicon nitride or amorphous carbon, and subsequently etching the PMD layer 366 using an RIE process. A contact liner 370 of titanium, 5 nanometers to 20 nanometers thick, is formed over the PMD layer 366, extending into the contact holes 422 and making contact with the emitter 356, the base contact region 358 and the collector contact region 360, the p-type source and drain regions 352, and the NRSD layers 336. An optional titanium nitride layer may be formed over the contact liner 370.

Figure 3G:
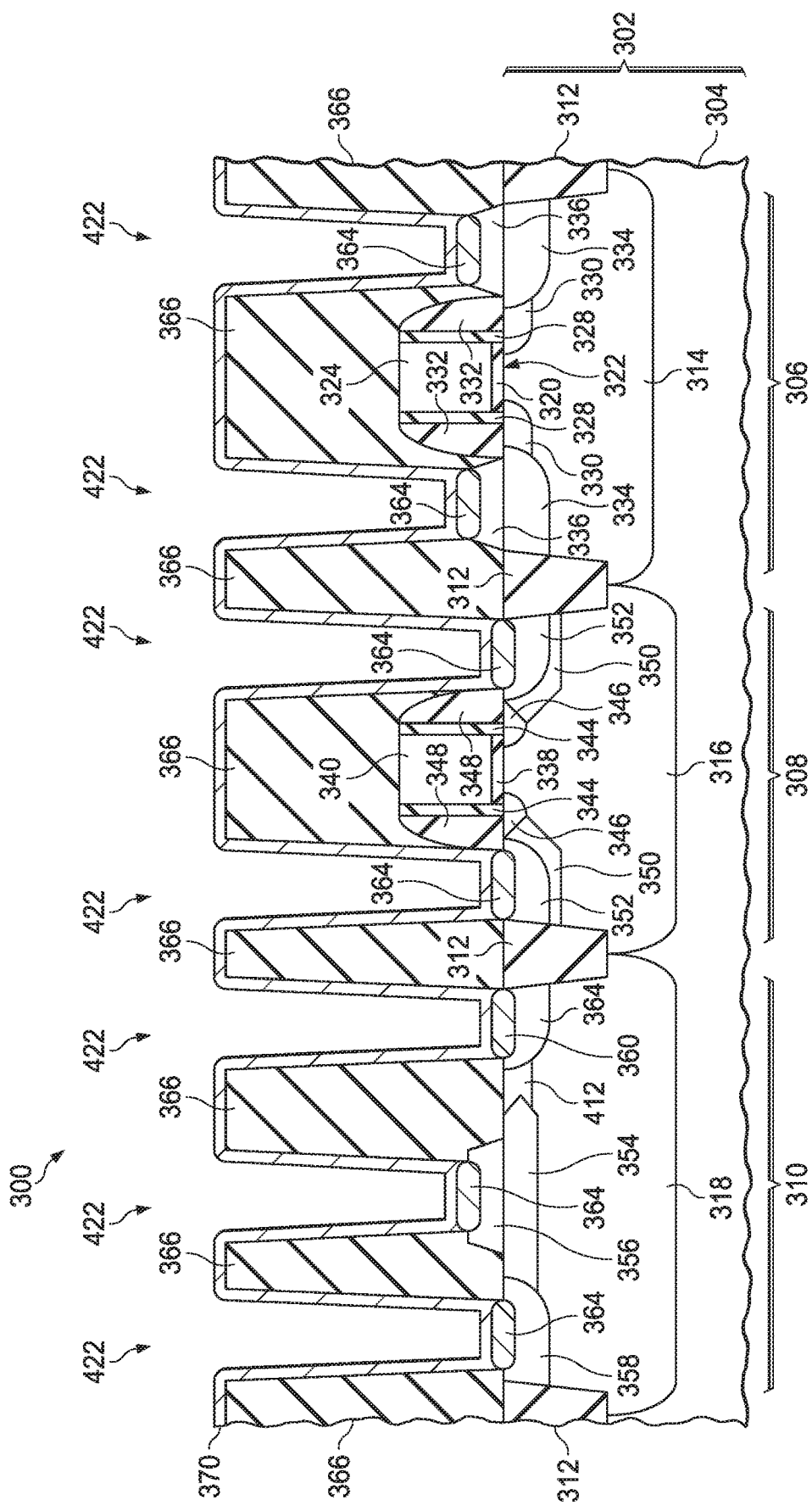

Referring to FIG. 3G, the contact liner 370 is heated so as to react with silicon in exposed semiconductor material to form metal silicide 364, in this case titanium silicide 364, on the emitter 356, the base contact region 358 and the collector contact region 360, the p-type source and drain regions 352, and the NRSD layers 336. Forming the metal silicide 364 from the contact liner 370 eliminates a need for a silicide block layer, which may advantageously reduce fabrication cost and complexity of the integrated circuit 300.

Figure 3H:
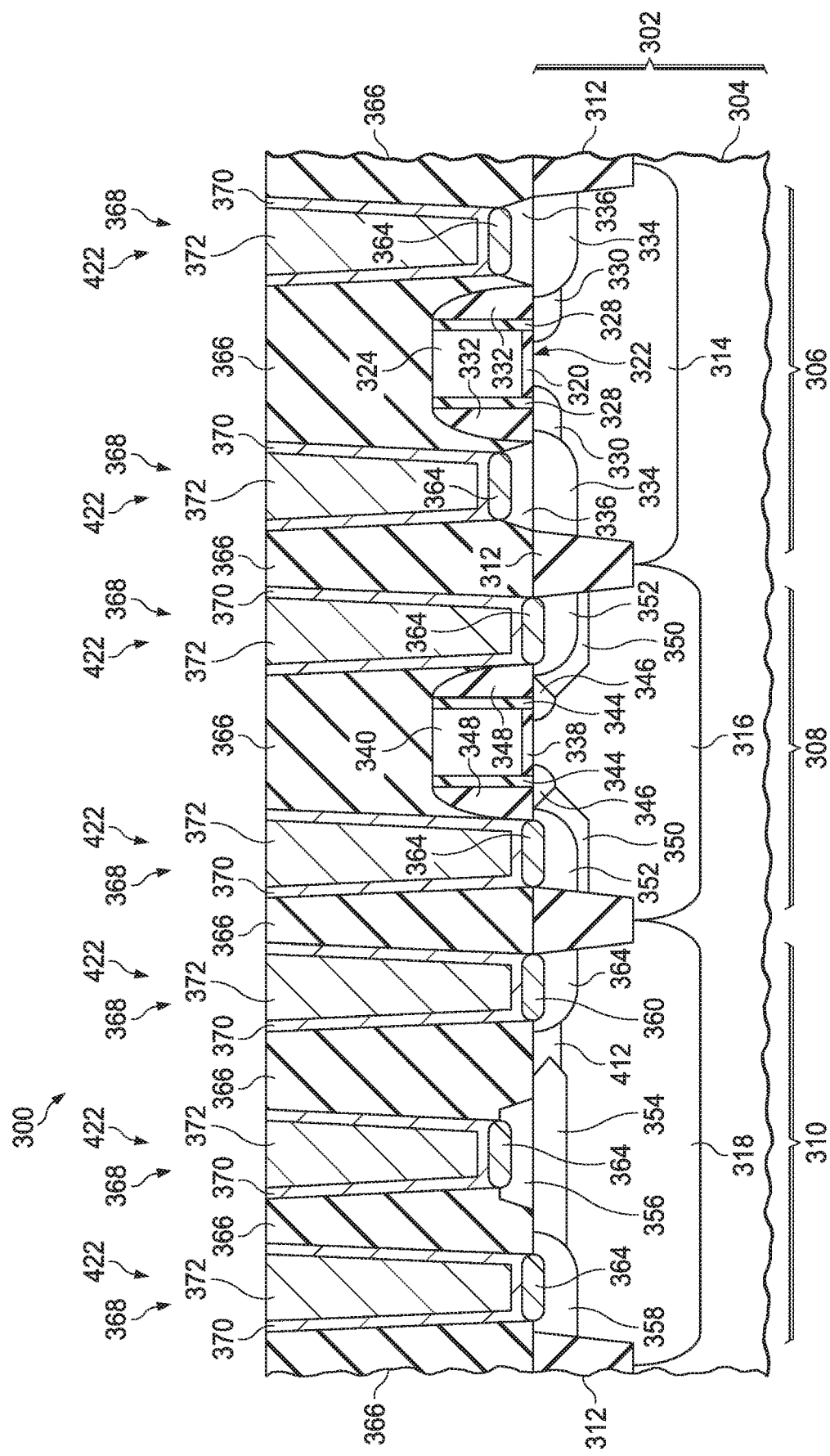

Referring to FIG. 3H, contact fill metal 372 is formed in the contact holes 422. The contact fill metal 372 may be formed by forming a layer of tungsten on the contact liner 370 using a metal organic chemical vapor deposition (MOCVD) process so that the layer of tungsten extends into the contact holes 422. The tungsten and the contact liner 370 on a top surface of the PMD layer 366 may subsequently be removed by a CMP process and/or an etchback process. The contact liner 370 and the contact fill metal 372 in the contact holes 422 provide contacts 368 which provide electrical connections through the metal silicide 364 to the emitter 356, the base contact region 358 and the collector contact region 360, the p-type source and drain regions 352, and the NRSD layers 336.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a substrate comprising silicon semiconductor material;
   an n-channel metal oxide semiconductor (NMOS) transistor, comprising n-type source and drain regions in the substrate adjacent to a gate of the NMOS transistor and n-type raised source and drain (NRSD) layers of n-type doped silicon on the n-type source and drain regions;
   a p-channel metal oxide semiconductor (PMOS) transistor, comprising p-type silicon-germanium (SiGe) stressors in the substrate adjacent to a gate of the PMOS transistor
   an NPN heterojunction bipolar transistor (NHBT) comprising:
   an n-type collector in the substrate;
   a p-type SiGe base in the substrate; and
   an n-type silicon emitter on the p-type SiGe base;
   contacts that respectively electrically connect to the n-type silicon emitter, the p-type SiGe base and the n-type collector, the NRSD regions and the SiGe stressors, each contact including a contact liner that forms a metal silicide.

2. The integrated circuit of claim 1, wherein a thickness of the p-type SiGe base is substantially equal to a thickness of the SiGe stressors.

3. The integrated circuit of claim 2, wherein a concentration of germanium in the p-type SiGe base is substantially equal to a concentration of germanium in the SiGe stressors.

4. The integrated circuit of claim 2, wherein an average concentration of germanium in the p-type SiGe base and an average concentration of germanium in the SiGe stressors is 25 percent to 35 percent.

5. The integrated circuit of claim 2, wherein a concentration of germanium in the p-type SiGe base and a concentration of germanium in the SiGe stressors is 40 percent to 65 percent proximate to a bottom of the p-type SiGe base and a bottom of the SiGe stressors, and is 20 percent to 30 percent proximate to a top of the p-type SiGe base and a top of the SiGe stressors.

6. The integrated circuit of claim 1, wherein a thickness of the p-type SiGe base is at least 25 percent less than a thickness of the SiGe stressors.

7. The integrated circuit of claim 6, wherein an average concentration of germanium in the p-type SiGe base is at least 10 percentage points lower than an average concentration of germanium in the SiGe stressors.

8. An integrated circuit, comprising:
   a substrate comprising silicon semiconductor material;
   an n-channel metal oxide semiconductor (NMOS) transistor, comprising n-type source and drain regions in the substrate adjacent to a gate of the NMOS transistor and n-type raised source and drain (NRSD) layers of n-type doped silicon on the n-type source and drain regions;
   a p-channel metal oxide semiconductor (PMOS) transistor, comprising p-type silicon-germanium (SiGe) stressors in the substrate adjacent to a gate of the PMOS transistor;
   an NPN heterojunction bipolar transistor (NHBT) comprising:
   an n-type collector in the substrate;
   a p-type SiGe base in the substrate; and
   an n-type silicon emitter on the p-type SiGe base; and
   metal silicide on the NRSD layers, the p-type SiGe stressors, and the n-type silicon emitter, wherein the metal silicide on the emitter comprises a refractory metal of a contact liner of a contact located over the emitter.

9. The integrated circuit of claim 8, wherein a thickness of the p-type SiGe base is at least 25 percent less than a thickness of the SiGe stressors.

10. The integrated circuit of claim 9, wherein an average concentration of germanium in the p-type SiGe base is at least 10 percentage points lower than an average concentration of germanium in the SiGe stressors.

11. The integrated circuit of claim 1, wherein said stressors are each located between a corresponding p-type source/drain region and an n-type well.

12. The integrated circuit of claim 8, wherein a channel of said PMOS transistor is located between the stressors.

13. The integrated circuit of claim 8, wherein said stressors are each located between a corresponding p-type source/drain region and an n-type well.

14. The integrated circuit of claim 1, wherein said metal silicide comprises titanium.

15. The integrated circuit of claim 8, wherein said refractory metal comprises titanium.

* * * * *